United States Patent
Jung

(10) Patent No.: US 10,283,486 B2
(45) Date of Patent: May 7, 2019

(54) SEMICONDUCTOR PACKAGE INCLUDING PACKAGE SUBSTRATE AND CHIP STACK IN WHICH A LOWER CHIP HAS A RESPECTIVE DUMMY PAD BY WHICH EACH UPPER CHIP IS CONNECTED TO THE PACKAGE SUBSTRATE

(71) Applicant: SAMSUNG ELECTRONICS CO., LTD., Suwon-Si, Gyeonggi-Do (KR)

(72) Inventor: Jin-Young Jung, Asan-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/798,655

(22) Filed: Oct. 31, 2017

(65) Prior Publication Data
US 2018/0145053 A1    May 24, 2018

(30) Foreign Application Priority Data
Nov. 22, 2016    (KR) .................... 10-2016-0156055

(51) Int. Cl.
*H01L 23/34*    (2006.01)
*H01L 21/44*    (2006.01)
(Continued)

(52) U.S. Cl.
CPC .......... *H01L 25/0657* (2013.01); *H01L 24/06* (2013.01); *H01L 24/24* (2013.01);
(Continued)

(58) Field of Classification Search
CPC ..... H01L 25/0657; H01L 24/06; H01L 24/24; H01L 24/32; H01L 24/49; H01L 24/73; H01L 24/82; H01L 25/50
See application file for complete search history.

(56) References Cited

U.S. PATENT DOCUMENTS 6,605,875 B2    8/2003 Eskildsen
7,173,340 B2    2/2007 Zhou et al.
(Continued)

OTHER PUBLICATIONS

Chang et al., "Development of VCI (Vertical Circuit Interconnection) Technology for Stacked Die Package," IEEE Catalog No. CFP11598-USB; ISBN: 978-4577-1388-0; pp. 137-139.

*Primary Examiner* — Alonzo Chambliss
(74) *Attorney, Agent, or Firm* — Volentine, Whitt & Francos, PLLC

(57) ABSTRACT

A semiconductor package includes a package substrate, semiconductor chips stacked on the package substrate, and electrical connectors that connect internal circuitry of each of the chips to the package substrate. Each of the semiconductor chips includes a chip selection pad for transmitting a chip selection signal to the internal circuitry of the semiconductor chip and a chip dummy pad, electrically isolated from the internal circuitry, along a first side of the semiconductor chip. The electrical connectors include a lower chip connector that electrically connects the package substrate to the chip selection pad of the lower semiconductor chip, a first auxiliary connector that electrically connects the package substrate to the chip dummy pad of the lower semiconductor chip, and a second auxiliary connector that electrically connects the chip dummy pad of the lower semiconductor chip to the chip selection pad of the upper semiconductor chip.

16 Claims, 14 Drawing Sheets

(51) Int. Cl.
*H01L 25/065* (2006.01)
*H01L 23/00* (2006.01)
*H01L 25/00* (2006.01)

(52) U.S. Cl.
CPC .............. *H01L 24/32* (2013.01); *H01L 24/49* (2013.01); *H01L 24/73* (2013.01); *H01L 24/82* (2013.01); *H01L 25/50* (2013.01); *H01L 2224/04042* (2013.01); *H01L 2224/05554* (2013.01); *H01L 2224/06165* (2013.01); *H01L 2224/06515* (2013.01); *H01L 2224/24145* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49096* (2013.01); *H01L 2224/49174* (2013.01); *H01L 2224/73215* (2013.01); *H01L 2224/73265* (2013.01); *H01L 2224/92244* (2013.01); *H01L 2224/92247* (2013.01); *H01L 2225/0651* (2013.01); *H01L 2225/06506* (2013.01); *H01L 2225/06524* (2013.01); *H01L 2225/06562* (2013.01); *H01L 2924/00014* (2013.01); *H01L 2924/15311* (2013.01)

(56) References Cited

U.S. PATENT DOCUMENTS

| | | | |
|---|---|---|---|
| 7,199,458 B2 | 4/2007 | Lee | |
| 7,582,953 B2 | 9/2009 | Lin | |
| 7,683,491 B2 | 3/2010 | Itoh et al. | |
| 8,525,349 B2 * | 9/2013 | Song | H01L 22/32 257/686 |
| 8,643,175 B2 | 2/2014 | Kim et al. | |
| 8,723,332 B2 * | 5/2014 | McElrea | H01L 24/24 257/777 |
| 8,729,689 B2 | 5/2014 | Hwang et al. | |
| 9,165,897 B2 | 10/2015 | Lee | |
| 2004/0145042 A1 | 7/2004 | Morita et al. | |
| 2006/0076690 A1 * | 4/2006 | Khandros | H01L 23/13 257/777 |
| 2009/0108425 A1 * | 4/2009 | Lee | H01L 23/3128 257/679 |
| 2011/0068449 A1 * | 3/2011 | Kook | H01L 23/49575 257/676 |
| 2013/0099392 A1 * | 4/2013 | McElrea | H01L 24/24 257/777 |
| 2014/0175660 A1 * | 6/2014 | Lee | H01L 24/49 257/773 |
| 2015/0200187 A1 * | 7/2015 | Park | H01L 24/32 257/777 |

* cited by examiner

SEMICONDUCTOR PACKAGE INCLUDING PACKAGE SUBSTRATE AND CHIP STACK IN WHICH A LOWER CHIP HAS A RESPECTIVE DUMMY PAD BY WHICH EACH UPPER CHIP IS CONNECTED TO THE PACKAGE SUBSTRATE

PRIORITY STATEMENT

This application claims the benefit of Korean Patent Application No. 10-2016-0156055, filed on Nov. 22, 2016, in the Korean Intellectual Property Office, the disclosure of which is hereby incorporated by reference in its entirety.

BACKGROUND

The inventive concept relates to a semiconductor package and to a method of manufacturing a semiconductor package. More particularly, the inventive concept relates to a semiconductor package including a plurality of stacked semiconductor chips, and to a method of manufacturing the semiconductor package.

Multi-chip semiconductor packages have been developed for use in high speed, high capacity miniaturized electronic products. In this respect, a semiconductor package having a structure including a plurality of semiconductor chips stacked one atop another may occupy a small area and process large amounts of data at high speeds. Therefore, a semiconductor package including stacked semiconductor chips may be used as a high capacity memory device.

SUMMARY

According to an aspect of the inventive concept, there is provided a semiconductor package including: a package substrate including electrically conductive terminals at an upper surface thereof, lower and upper semiconductor chips stacked on the upper surface of the package substrate with the upper semiconductor chip disposed on the lower semiconductor chip, and lower and upper chip selection members. Each of the lower and upper semiconductor chips has an upper surface including a first side. The lower semiconductor chip comprises a chip selection pad dedicated to transmit a chip selection signal to an internal circuit of the lower semiconductor chip and a chip dummy pad electrically isolated from the internal circuit of the lower semiconductor chip successively disposed in a pad arrangement along the first side of the upper surface of the lower semiconductor chip, and the upper semiconductor chip comprises a chip selection pad dedicated to transmit a chip selection signal to an internal circuit of the upper semiconductor chip and a chip dummy pad electrically isolated from the internal circuit of the upper semiconductor chip successively disposed in a pad arrangement along the first side of the upper surface of the upper semiconductor chip. The lower chip selection member electrically connects the package substrate to the chip selection pad of the lower semiconductor chip; and the upper chip selection member comprises a first auxiliary connector electrically connecting the package substrate to the chip dummy pad of the lower semiconductor chip and a second auxiliary connector electrically connecting the chip dummy pad of the lower semiconductor chip to the chip selection pad of the upper semiconductor chip.

According to another aspect of the inventive concept, there is provided a semiconductor package including: a package substrate, first, second and third semiconductor chips stacked on the package substrate, and first, second and third chip selection members. The first, second and third semiconductor chips are of same type and each of the first, second and third semiconductor chips has an arrangement of conductive pads including a chip selection pad dedicated to transmit a chip selection signal to an internal circuit of the semiconductor chip and first and second chip dummy pads electrically isolated from the internal circuit of the semiconductor chip, the chip selection pad and the chip dummy pads being disposed in succession in said arrangement adjacent a first side of the semiconductor chip. The first chip selection member connects the chip selection pad of the first semiconductor chip to the package substrate. The second chip selection member comprises a first auxiliary connector that connects the first chip dummy pad of the first semiconductor chip to the package substrate and a second auxiliary connector that connects the chip selection pad of the second semiconductor chip to the chip dummy pad of the first semiconductor chip. The third chip selection member comprises a third auxiliary connector that connects the second chip dummy pad of the first semiconductor chip to the package substrate, a fourth auxiliary connector that connects the first chip dummy pad of the second semiconductor chip to the second chip dummy pad of the first semiconductor chip, and a fifth auxiliary connector that connects the chip selection pad of the third semiconductor chip to the first chip dummy pad of the second semiconductor chip.

According to another aspect of the inventive concept, there is provided a semiconductor package including: a package substrate, and first to third semiconductor chips sequentially stacked on the package substrate. The first to third semiconductor chips are of same type and each of the first to third semiconductor chips has a quadrilateral shape having first to fourth sides in a clockwise direction and includes an L-shaped pad arrangement in which a plurality of pads are arranged along the first and second sides. The first and second sides of the second semiconductor chip are on the first semiconductor chip so that the second semiconductor chip does not overlap the L-shaped pad arrangement of the first semiconductor chip. Also, the first and second sides of the second semiconductor chip are respectively spaced apart from the first and second sides of the first semiconductor chip, and the third and fourth sides of the third semiconductor chip are on the second semiconductor chip so that the third semiconductor chip does not overlap the L-shaped pad arrangement of the second semiconductor chip, and the third and fourth sides of the third semiconductor chip are respectively spaced apart from the first and second sides of the second semiconductor chip.

According to another aspect of the inventive concept, there is provided

A semiconductor package comprising a package substrate having electrical terminals disposed along an upper surface thereof, a stack of semiconductor chips disposed on the upper surface of the package substrate, and lower and upper chip electrical connectors. Each of the semiconductor chips has an internal circuit, an upwardly facing rectangular surface, and a row of conductive pads exposed at the rectangular surface as extending adjacent a first side of the rectangular surface. The stack of semiconductor chips includes a lower semiconductor chip and an upper semiconductor chip. The first sides of the rectangular surfaces of the lower and upper semiconductor chips are disposed parallel to and adjacent each other at one side of the package, and the upper semiconductor chip is disposed on the lower semiconductor chip as offset therefrom in a direction perpendicular to the first sides of the rectangular surfaces of the lower and upper semiconductor chips, in a plan view of the semiconductor chips, such that the row of conductive pads of the lower semiconductor chip is not covered by the upper semiconductor chip. Also, for each of the lower and upper semiconductor chips, the row of the conductive pads of the semiconductor chip includes a chip selection pad electrically connected to the internal circuit of the semiconductor chip and dedicated to transmit a chip selection signal to the internal circuit of the semiconductor chip, and a chip dummy pad electrically isolated from the internal circuit of the semiconductor chip. The lower chip electrical connector spans one of the electrical terminals of the package substrate and the chip selection pad of the lower semiconductor chip so as to electrically connect the package substrate to the internal circuit of the upper semiconductor chip via the chip selection pad of the lower semiconductor chip. The upper chip electrical connector spans one of the electrical terminals of the package substrate and the chip dummy pad of the lower semiconductor chip, and spans the chip dummy pad of the lower semiconductor chip and the chip selection pad of the upper semiconductor chip so as to electrically connect the package substrate to the internal circuit of the upper semiconductor chip via the chip dummy pad of the lower semiconductor chip.

According to still another aspect of the inventive concept, there is provided a method of manufacturing a semiconductor package, the method including: preparing first and second semiconductor chips, wherein the first and second semiconductor chips are of same type and each of the first and second semiconductor chips has a first side and a second side sharing a vertex with the first side and includes an L-shaped pad arrangement in which a chip selection pad, a chip dummy pad, and a chip activation pad are formed along the first and second sides; forming an adhesive member on a bottom surface of the first semiconductor chip and disposing the first semiconductor chip on a package substrate; disposing the second semiconductor chip on the first semiconductor chip, wherein an adhesive member is formed on a bottom surface of the second semiconductor chip and the first and second sides of the second semiconductor chip are disposed on the first semiconductor chip so that the second semiconductor chip does not overlap an L-shaped pad arrangement of the first semiconductor chip, wherein the first and second sides of the second semiconductor chip are respectively spaced apart from the first and second sides of the first semiconductor chip when viewed from above; curing the adhesive member; forming a first chip selection member, a first auxiliary connector, and a first chip connecting member, which respectively connect a chip selection pad, a chip dummy pad, and a chip activation pad of the first semiconductor chip to the package substrate; and forming a second auxiliary connector for connecting the chip selection pad of the second semiconductor chip to the chip dummy pad of the first semiconductor chip, and a second chip connecting member for connecting the chip activation pad of the second semiconductor chip to the chip activation pad of the first semiconductor chip.

BRIEF DESCRIPTION OF THE DRAWINGS

The inventive concept will be more clearly understood from the following detailed description taken in conjunction with the accompanying drawings in which.

DETAILED DESCRIPTION

Hereinafter, the inventive concept will be described in detail with reference to the accompanying drawings.

Figure 1:
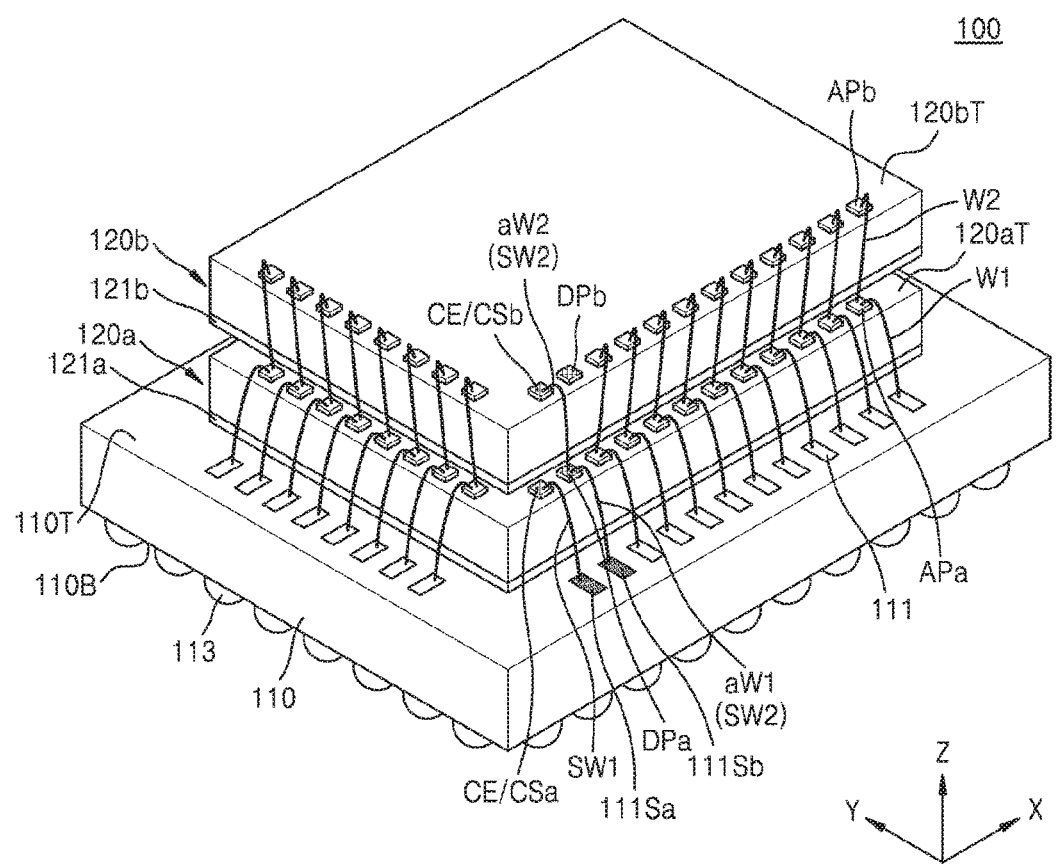
FIGS. 1 and 2 are respectively a perspective view and a plan view of a semiconductor package according to the inventive concept.
Figure 2:
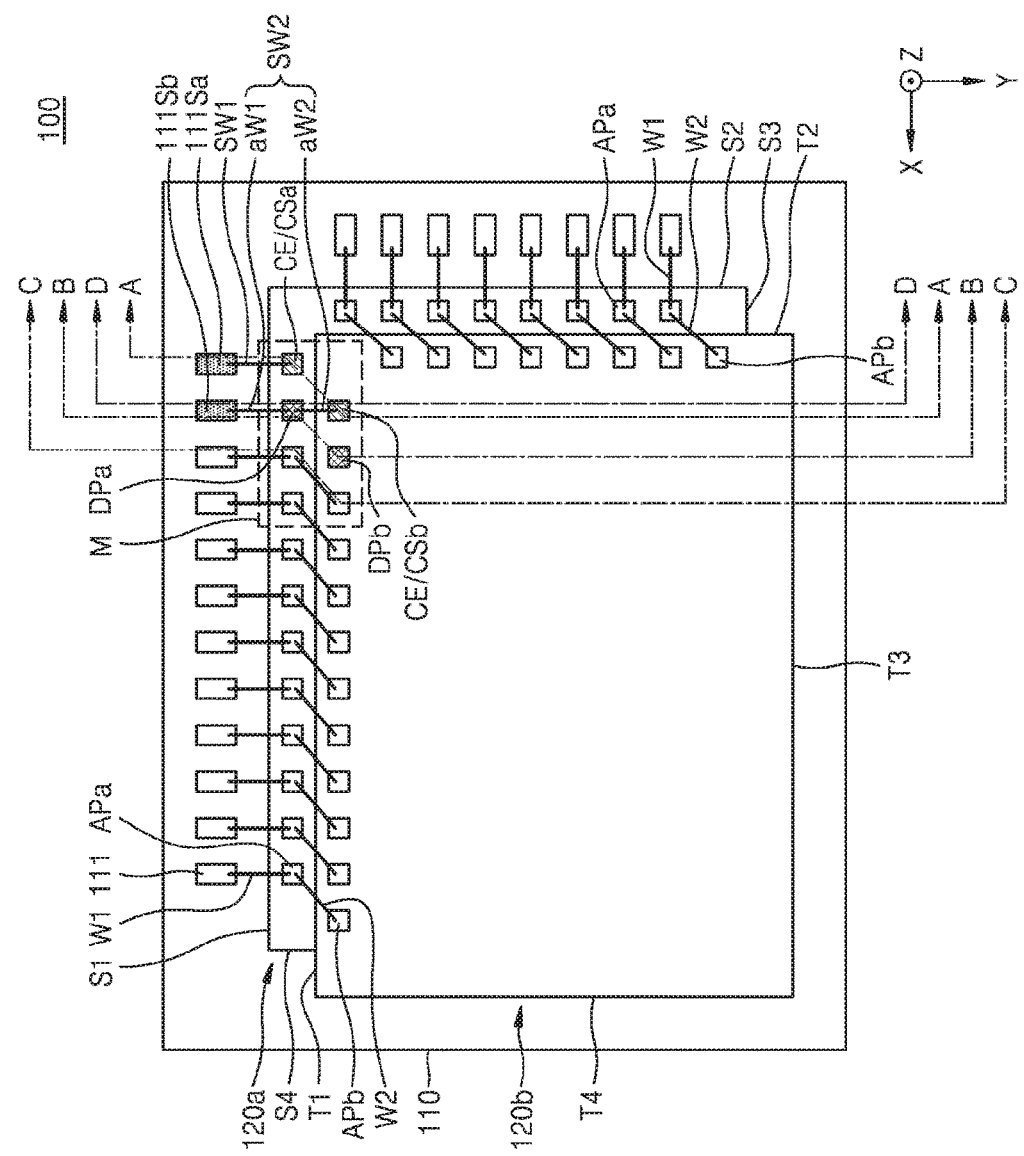
Figure 3:
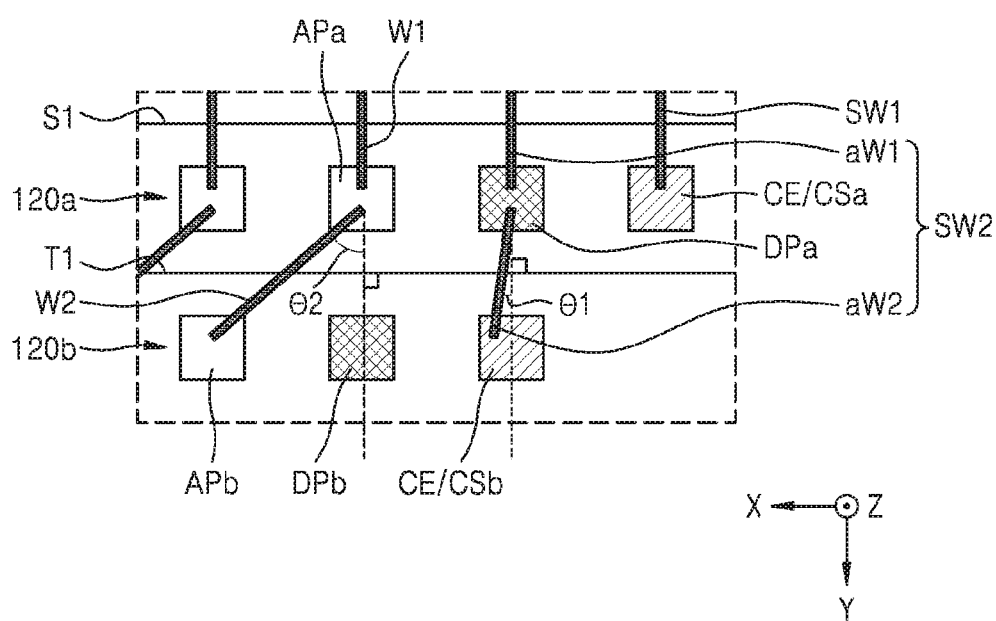
FIG. 3 is an enlarged view of a portion M of the package shown in FIG. 2 according to the inventive concept.

FIGS. 1 and 2 are respectively a perspective view and a plan view of an example of a semiconductor package 100 according to the inventive concept. FIG. 3 is an enlarged view of a portion M in FIG. 2. FIGS. 4A to 4D are cross-sectional views respectively taken along lines A-A, B-B, C-C, and D-D in FIG. 2. FIG. 4E is a schematic diagram of a first semiconductor chip 120*a*. FIG. 4F is a schematic diagram of a second semiconductor chip 120*b*. Referring to the cross-sectional views of FIGS. 4A, 4B, and 4C, cross sections of the same region of first and second semiconductor chips 120*a* and 120*b* are shown. On the other hand, the cross-sectional view of FIG. 4D is a cross-sectional view taken along the line D-D passing through a first chip dummy pad DPa of the first semiconductor chip 120*a* and a second chip dummy pad DPb of the second semiconductor chip 120*b*. In FIG. 4D, the cross section of the first semiconductor chip 120*a* and the cross section of the second semiconductor chip 120*b* are not cross sections of the same region. Like reference numerals in the drawings denote like elements, and the second occurrences of descriptions of those elements will be simplified.

Referring to FIGS. 1 to 4F, the semiconductor package 100 may include the first semiconductor chip 120*a* and the second semiconductor chip 120*b*, which are sequentially stacked on a package substrate 110. Although only two semiconductor chips are shown in FIGS. 1 to 4D, the inventive concept is not limited thereto and the semiconductor package 100 may include three or more semiconductor chips. The first and second semiconductor chips 120*a* and 120*b* may be semiconductor chips of the same type. Here, the term "same type" may refer to the fact that the chips have the same physical characteristics (footprint, thickness, number and positional relationships of contacts, etc.) and function (memory, for example). In some examples, the first and second semiconductor chips 120*a* and 120*b* may be dynamic random access memories (DRAMs), static random access memories (SRAMs), phasechange random access memories (PRAMs), magnetoresistive random access memories (MRAMs), ferroelectric random access memories (FeRAMs), resistive random access memories (RRAMs), flash memories, or electrically erasable programmable read-only memories (EEPROMs). In some examples, the first and second semiconductor chips 120a and 120b may be mobile dynamic random access devices, and the semiconductor package 100 may be a mobile memory package of a mobile device.

The package substrate 110 may be any of various types of substrates such as a printed circuit board (PCB), an organic substrate, an inorganic substrate, a glass substrate, or a flexible substrate. In addition, the package substrate 110 may be one that is appropriate for use in various types of electronic devices such as a mobile device, a memory device, a display device or a display driver integrated circuit (DDI). The package substrate 110 may be a multilayered (printed) circuit board having vias and various circuit patterns therein connected to the vias.

The package substrate 110 may include electrically conductive terminals, namely, substrate pads 111, 111Sa, and 111Sb exposed on the top surface 110T (of the board) thereof. The substrate pads 111, 111Sa, and 111Sb may include a first chip selection substrate pad 111Sa (dedicated) for transmitting a chip enable signal/chip selection signal for activating/selecting the first semiconductor chip 120a, a second chip selection substrate pad 111Sb (dedicated) for transmitting a chip enable signal/chip selection signal for activating/selecting the second semiconductor chip 120b, and an active substrate pad 111 (dedicated) for transmitting various electrical signals for driving the first and second semiconductor chips 120a and 120b. The active substrate pad 111 may transmit an address signal, a control signal, a data input or output signal of a memory cell, or supply a power supply voltage or a ground potential.

The substrate pads 111, 111Sa, and 111Sb may be arranged to be respectively adjacent to first chip pads CE/CSa, DPa, and APa of the first semiconductor chip 120a and second chip pads CE/CSb, DPb, and APb of the second semiconductor chip 120b. That is, the substrate pads 111, 111Sa, and 111Sb may be arranged to be adjacent to first and second sides S1 and S2 of the first semiconductor chip 120a. Accordingly, the substrate pads 111, 111Sa, and 111Sb may have an L-shaped pad arrangement. The first chip pads CE/CSa, DPa, and APa may be provided as redistribution patterns (wiring) of the first semiconductor chip 120a. The second chip pads CE/CSb, DPb, and APb may be provided as redistribution patterns (wiring) of the second semiconductor chip 120b. The arrangement of the first chip pads CE/CSa, DPa, and APa and the second chip pads CE/CSb, DPb, and APb will be described in detail later.

Although not shown in FIGS. 1 to 4D, each of the substrate pads 111, 111Sa, and 111Sb may be connected to an internal circuit pattern or via contact (e.g., plug) of the package substrate 110. The circuit pattern or via contact may be electrically connected to a bump pad exposed on the bottom surface 110B of the package substrate 110. The package substrate 110 may be connected to at least one conductive bump 113, for example, a solder ball, through the bump pad. The semiconductor package 100 may be electrically connected to external electronic devices through the conductive bump 113.

The first and second semiconductor chips 120a and 120b may be semiconductor chips of the same type and thus may have the same internal circuit structures and pad arrangements. Hereinafter, the first semiconductor chip 120a will be described first, and the second semiconductor chip 120b will be described briefly since the second semiconductor chip 120b of this example has the same structure as the first semiconductor chip 120a.

The first semiconductor chip 120a may be attached to the package substrate 110 through a first adhesive member 121a. The second semiconductor chip 120b may be attached to the first semiconductor chip 120a through a second adhesive member 121b. The first and second semiconductor chips 120a and 120b are arranged so that their active surfaces face upward.

The first semiconductor chip 120a may include the first chip pads CE/CSa, DPa, and APa exposed on the top surface 120aT of the first semiconductor chip 120a. The first chip pads CE/CSa, DPa, and APa may be arranged along a first side S1 of the top surface 120aT of the first semiconductor chip 120a and a second side S2 of the top surface 120aT which forms a vertex with the first side S1. No pads having the same function as the first chip pads CE/CSa, DPa, and APa are provided in an area that is adjacent to a third side S3 parallel to the first side S1 and a fourth side S4 parallel to the second side S2. Accordingly, the first chip pads CE/CSa, DPa, and APa may have an L-shaped pad arrangement when viewed from above the first semiconductor chip 120a. That is, considering the upper surface of the first semiconductor chip 120a to have a rectangular central region having first and second sides aligned with the inner edges of the first chip pads CE/CSa, DPa, and APa, the L-shaped (peripheral) region extending along sides S3 and S4 to the outside of the central region may be devoid of chip pads.

The first chip pads CE/CSa, DPa, and APa may include a first chip selection pad CE/CSa (dedicated) for transmitting a chip enable signal/chip selection signal, a first chip dummy pad DPa electrically isolated (i.e., in a floated state) from an internal circuit ICa of the first semiconductor chip 120a, and a first chip activation pad(s) APa (dedicated) for transmitting various electrical signals for driving the first semiconductor chip 120a. Each first chip activation pad APa may be an address pad for receiving an address signal, a control signal pad for receiving a control signal, a data input/output pad for inputting/outputting data of a memory cell, a power supply pad for supplying a power supply voltage, or a ground potential pad for supplying a ground potential. Although FIGS. 1 and 2 show an example in which the first chip selection pad CE/CSa of the first chip pads CE/CSa, DPa, and APa is at the end of the first side S1, the inventive concept is limited thereto. The first chip selection pad CE/CSa may be situated at a central portion of the first side S1.

Similarly, the second semiconductor chip 120b may include the second chip pads CE/CSb, DPb, and APb exposed on the top surface 120bT of the second semiconductor chip 120b. The second chip pads CE/CSb, DPb, and APb may include a second chip selection pad CE/CSb (dedicated) for transmitting a chip enable signal/chip selection signal, a second chip dummy pad DPb electrically isolated from an internal circuit ICb of the second semiconductor chip 120b, and a second chip activation pad(s) APb (dedicated) for transmitting various electrical signals for driving the second semiconductor chip 120b.

The second chip pads CE/CSb, DPb, and APb may be arranged along a first side T1 and a second side T2 of the second semiconductor chip 120b. Accordingly, the second chip pads CE/CSb, DPb, and APb may have an L-shaped pad arrangement. No pads having the functions of the second chip pads CE/CSb, DPb, and APb are provided in an area that is adjacent to a third side T3 parallel to the first side T1 and a fourth side T4 parallel to the second side T2. That is, considering the upper surface of the second semiconductor chip 120*b* to have a rectangular central region having first and second sides aligned with the inner edges of the second chip pads CE/CSb, DPb, and APb, the L-shaped (peripheral) region extending along sides T3 and T4 to the outside of the central region may be devoid of chip pads.

The second semiconductor chip 120*b* may be disposed on the first semiconductor chip 120*a* so as not to overlap the first chip pads CE/CSa, DPa, and APa which have an L-shaped pad arrangement. That is, the second semiconductor chip 120*b* may be disposed so that the first and second sides T1 and T2 of the second semiconductor chip 120*b* are positioned on the first semiconductor chip 120*a* and the first side T1 of the second semiconductor chip 120*b* is spaced apart from the first side S1 of the first semiconductor chip 120*a* by a predetermined distance in a first direction (Y direction). The second side T2 of the second semiconductor chip 120*b* may be spaced apart from the second side S2 of the first semiconductor chip 120*a* by a predetermined distance in a second direction (X direction). The first and second directions (Y and X directions) may be perpendicular to each other. Accordingly, in this example, the first and second semiconductor chips 120*a* and 120*b* having the same footprints may be stacked as diagonally offset from one another to form an L-shaped stepped or "staircase" structure in which the exposed portion of the top surface of the first semiconductor chip 120*a* is an L-shaped tread of the structure.

A connection structure may electrically connect the first semiconductor chip 120*a* to the package substrate 110 and the second semiconductor chip 120*b* to the first semiconductor chip 120*a*. The connection structure may be any of various types of structures including conductive material. In some examples such as that shown in FIGS. 1 to 4D, the connection structure may be wires attached to the pad by wire bonding. However, the inventive concept is not limited thereto.

In other examples, the connection structure may be formed directly on a portion of the top surface of the package substrate 110 and on portions of the side surfaces and portions of the top surfaces of the first and second semiconductor chips 120*a* and 120*b*, or may be formed directly on an insulating layer. In this case, the connection structure may include a conductive polymer or a conductive ink, and may be formed by a dispensing method or the like. This will be described with reference to FIGS. 9 and 10. Because the second semiconductor chip 120*b* is disposed so as not to overlap the first chip pads CE/CSa, DPa, and APa of the first semiconductor chip 120*a*, which have an L-shaped pad arrangement, the second adhesive member 121*b* interposed between the first and second semiconductor chips 120*a* and 120*b* may be relatively thin. A first chip selection member (e.g., a first chip selection wire SW1) connecting the first chip selection pad CE/CSa of the first semiconductor chip 120*a* to the first chip selection substrate pad 111Sa may extend vertically a first amount from the top surface 120*a*T of the first semiconductor chip 120*a* so as to have a first height Hw.

Accordingly, if the chips 120*a* and 120*b* were stacked on each other as aligned, i.e., if the second semiconductor chip 120*b* overlapped the chip pads of the first semiconductor chip 120*a*, the second adhesive member 121*b* would be required to have a height equal to or greater than the first height Hw so that it could receive therein the first chip selection wire SW1. In this case, a large amount of adhesive would have to be injected between the first and second semiconductor chips 120*a* and 120*b*, thereby increasing the manufacturing cost of the semiconductor package 100. In addition, a thick second adhesive member 121*b* would cause the overall thickness of the semiconductor package 100 to be great, and thus, a thickness margin of the first and second semiconductor chips 120*a* and 120*b* could be insufficient for a particular application.

In addition, if the second semiconductor chip 120*b* overlapped the first chip pads CE/CSa, DPa, and APa of the first semiconductor chip 120*a*, which have an L-shaped pad arrangement, a bonding process for wires to be connected to the first semiconductor chip 120*a* would be required before the second semiconductor chip 120*b* were disposed on the first semiconductor chip 120*a*. Thus, a curing process for curing the first adhesive member 121*a* would have to be performed a plurality of times, thereby rendering the process of manufacturing the semiconductor package 100 complex.

In contrast, according to the semiconductor package 100 of the inventive concept, the thickness or "height" Hat of the second adhesive member 121*b* is not dependent on the first height Hw. Thus, the second adhesive member 121*b* may be relatively thin. Accordingly, not only may the manufacturing cost of the semiconductor package 100 be minimized, but also the thickness of the semiconductor package 100 may be minimized Therefore, the inventive concept allows for the size and thickness of an electronic device including the semiconductor package 100 to be kept to a minimum.

Furthermore, the semiconductor package 100 may be manufactured in a relatively simple process. That is, the semiconductor package 100 may be manufactured by sequentially attaching the first and second semiconductor chips 120*a* and 120*b* onto the package substrate 110 by using the first and second adhesive members 121*a* and 121*b*, curing the first and second adhesive members 121*a* and 121*b* through a single curing process, and then performing wire bonding. Accordingly, the manufacturing cost of the semiconductor package 100 may be minimized and productivity may be improved.

The first chip selection pad CE/CSa of the first semiconductor chip 120*a* may be electrically connected to the first chip selection substrate pad 111Sa through the first chip selection wire SW1. That is, the first chip selection pad CE/CSa may receive through the first chip selection wire SW1 an external signal for selecting the first semiconductor chip 120*a* and transmit the received external signal to an internal circuit ICa of the first semiconductor chip 120*a*.

The first chip activation pad APa may be electrically connected to the active substrate pad 111 through the first chip connection structure, for example, the first chip wire W1. The first chip activation pad APa may transmit an address signal, a control signal, or a data input or output signal of a memory cell, or may receive a power supply voltage or a ground potential. As described above, the first chip activation pad APa may be any one of an address pad, a control signal pad, a data input or output pad, a power supply pad, and a ground potential pad.

The first chip dummy pad DPa is connected to the package substrate 110 through a first auxiliary connector, for example, a first auxiliary wire aW1. However, the first chip dummy pad DPa is electrically isolated from the internal circuit ICa of the first semiconductor chip 120*a*. Therefore, as will be described later, the first chip dummy pad DPa may allow for signal transmission therethrough to the second semiconductor chip 120*b* but not to the first semiconductor chip 120*a*. Thus, reference to the pad DPa as a "dummy pad" of the first semiconductor chip 120*a* will be understood by those of ordinary skill in the art.

The second chip selection pad CE/CSb of the second semiconductor chip 120b may be electrically connected to the second chip selection substrate pad 111Sb through a second chip selection member, for example, a second chip selection wire SW2. The second chip selection wire SW2 may include the first auxiliary connector, for example, the first auxiliary wire aW1, and a second auxiliary connector, for example, a second auxiliary wire aW2. Specifically, the second chip selection substrate pad 111Sb may be connected to the first chip dummy pad DPa by the first auxiliary wire aW1, and the first chip dummy pad DPa may be connected to the second chip selection pad CE/CSb by the second auxiliary wire aW2. The second chip selection pad CE/CSb may receive an external signal for selecting the second semiconductor chip 120b through the second chip selection wire SW2 and transmit the received external signal to an internal circuit ICb of the second semiconductor chip 120b. In this case, the second chip selection pad CE/CSb is not directly connected to the package substrate 110 through any wire. In addition, the second chip selection pad CE/CSb is not connected to the first chip selection pad CE/CSa and the first chip activation pad APa through wires.

The second chip activation pad APb may be electrically connected to the first chip activation pad APa through a second chip connecting member, for example, a second chip wire W2. The first chip activation pad APa may be electrically connected to the active substrate pad 111 through the first chip wire W1. The second chip activation pad APb may be any one of an address pad, a control signal pad, a data input or output pad, a power supply pad, and a ground potential pad. The second chip activation pad APb may transmit an address signal, a control signal, or a data input or output signal of a memory cell, or may receive a power supply voltage or a ground potential.

The first and second chip activation pads APa and APb may receive the same electrical signal because they are connected in common to an active substrate pad 111. On the contrary, the first and second chip selection pads CE/CSa and CE/CSb transmit electrical signals for selecting the first and second semiconductor chips 120a and 120b, respectively, and thus are not connected in common to the same active substrate pad but are connected to respective substrate pads 111Sa and 111Sb.

FIGS. 4A to 4D illustrate the relationship between the first and second chip selection pads CE/CSa and CE/CSb, the first and second chip dummy pads DPa and DPb, and the first and second chip activation pads APa and APb.

Figure 4A:
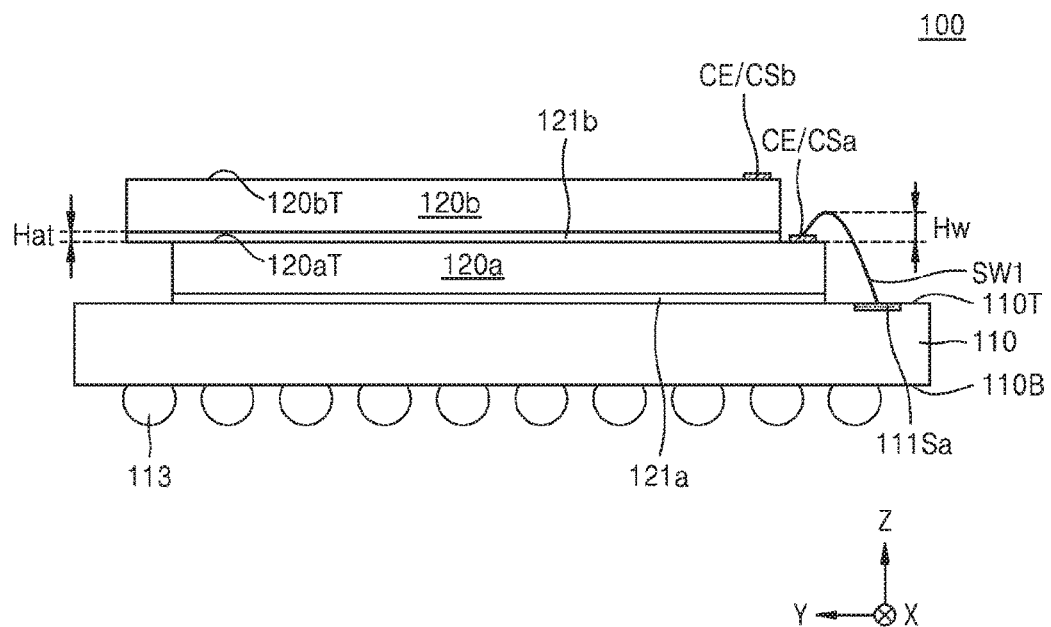
FIGS. 4A, 4B, 4C and 4D are cross-sectional views respectively taken along lines A-A, B-B, C-C, and D-D in FIG. 2 according to the inventive concept.

Referring to FIG. 4A, the first chip selection pad CE/CSa and the second chip selection pad CE/CSb correspond to each other positionally (i.e., are located at the same relative positions in relation to their respective chips), but are not connected to each other by a wire. The first chip selection pad CE/CSa may be connected to the first chip selection substrate pad 111Sa by the first chip selection wire SW1.

Figure 4B:
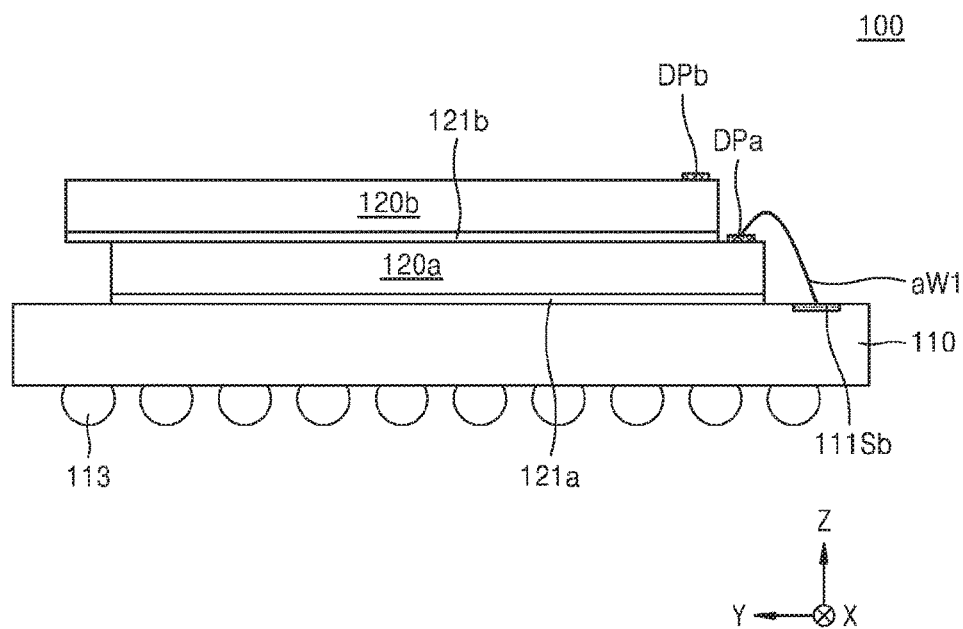

Referring to FIG. 4B, the first chip dummy pad DPa and the second chip dummy pad DPb correspond to each other positionally, but are not connected to each other by a wire. The first chip dummy pad DPa may be connected to the second chip selection substrate pad 111Sb by the first auxiliary wire aW1. The first auxiliary wire aW1 is not for transmitting an electrical signal to the first semiconductor chip 120a but for transmitting an electrical signal to the second semiconductor chip 120b, and may be used as a portion of the second selection wire SW2.

Figure 4C:
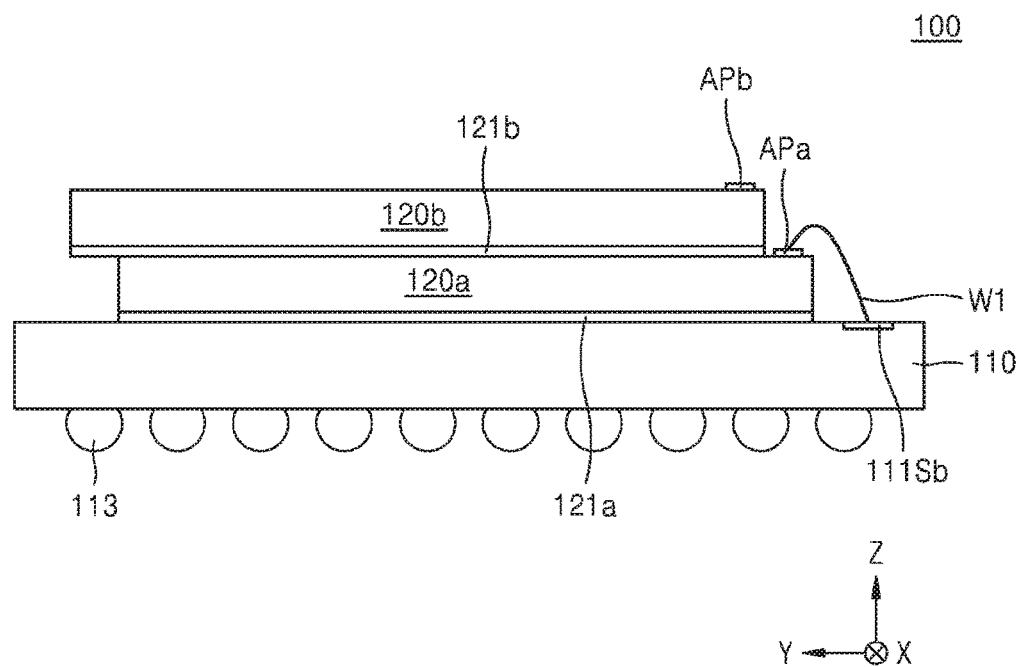
Figure 4D:
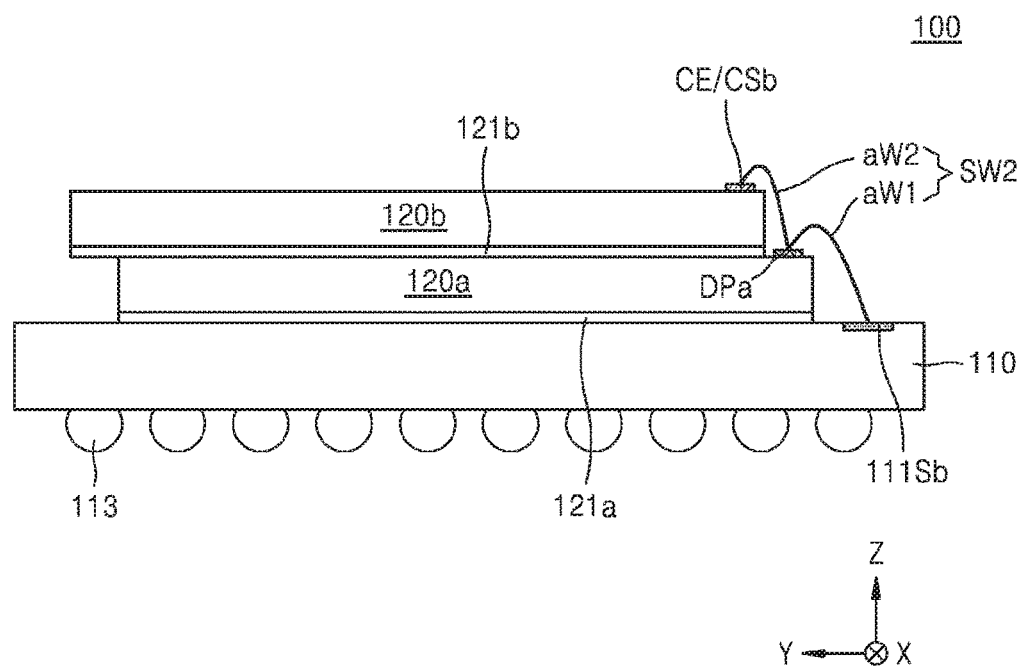
Figure 4E:
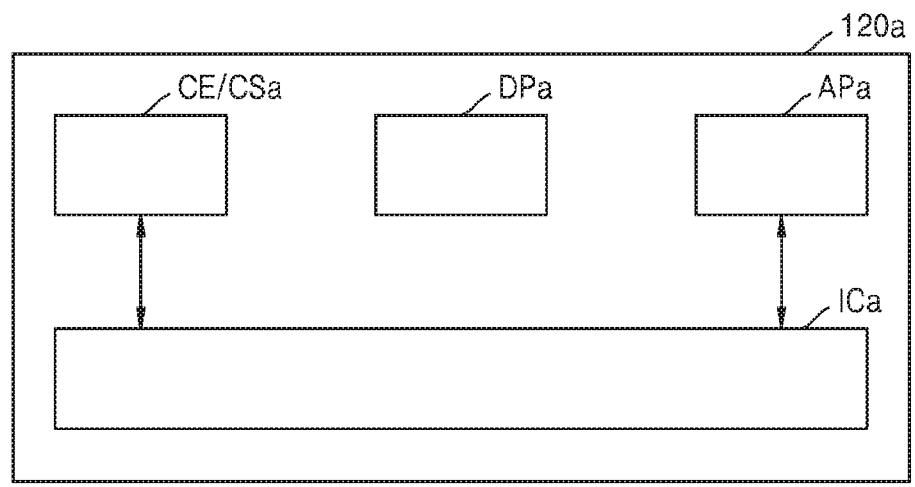
FIG. 4E is a schematic diagram of a first semiconductor chip according to the inventive concept.
Figure 4F:
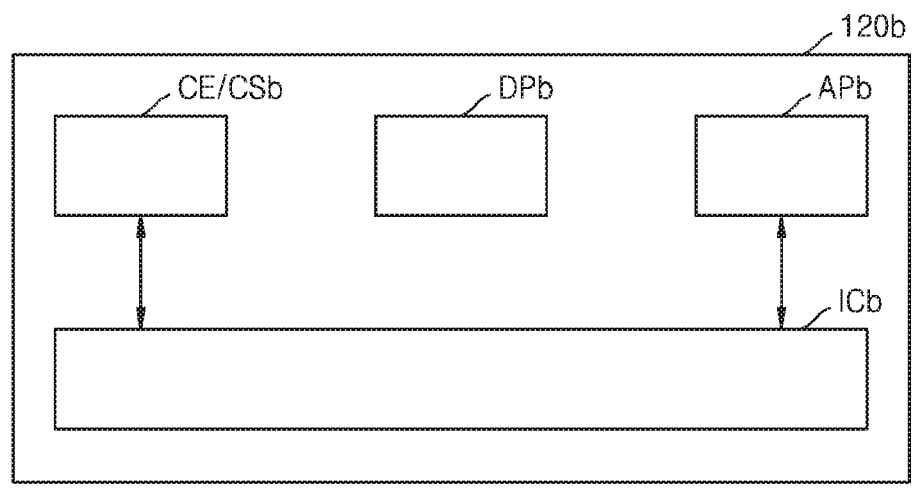
FIG. 4F is a schematic diagram of a second semiconductor chip according to the inventive concept.

Referring to FIG. 4C, the active substrate pad 111 and the first chip activation pad APa may be connected to each other by the first chip wire W1. The second chip activation pad APb may be connected to the first chip activation pad APa by the second chip wire W2. The first chip activation pad APa and the second chip activation pad APb may transmit the same electrical signal.

Referring to FIG. 4D, the second chip selection substrate pad 111Sb and the first chip dummy pad DPa may be connected to each other by the first auxiliary wire aW1. The second chip selection pad CE/CSb may be connected to the first chip dummy pad DPa through the second auxiliary wire aW2. That is, the second chip selection pad CE/CSb and the second chip selection substrate pad 111Sb may be connected to each other by the second chip selection wire SW2 including the first and second auxiliary wires aW1 and aW2.

In general, in the stacking of semiconductor chips having the same pad arrangements, some of the pads of an upper semiconductor chip may be connected to a package substrate via some of the pads of a lower semiconductor chip. In this case, because a chip selection pad for selecting the upper semiconductor chip must not transmit the same electrical signal to the internal circuit of the lower semiconductor chip, the chip selection pad of the upper semiconductor chip is not connected to the internal circuit of the lower semiconductor chip but rather is directly connected to the package substrate. In this case, there may be a problem that a wire directly connected from the upper semiconductor chip to the package substrate and a wire connected from the lower semiconductor chip to the package substrate are electrically short-circuited.

On the contrary, according to the semiconductor package 100 of inventive concept, the second chip selection wire SW2 connected to the second chip selection pad CE/CSb may be connected to the package substrate 110 via the first chip dummy pad DPa. Therefore, because all wires connected to the second semiconductor chip 120b may be connected to the package substrate 110 via pads of the first semiconductor chip 120a, a short circuit between the wires may be prevented. In addition, the amount of wire required to manufacture the semiconductor package 100 is minimized in this way, thereby lowering the manufacturing cost.

Because the second chip dummy pad DPb is electrically isolated from the internal circuit of the second semiconductor chip 120b, the second chip dummy pad DPb is not used to transmit an electrical signal from the external device to the second semiconductor chip 120b. Therefore, the second chip dummy pad DPb may not be connected to any wire and may be electrically isolated. Accordingly, the number of wires directly connecting the first semiconductor chip 120a to the package substrate 110 is greater than the number of wires connected to the second semiconductor chip 120b.

In some examples, the second chip dummy pad DPb may be a pad through which a signal from a wire passes only when another semiconductor chip is on the second semiconductor chip 120b. When a third semiconductor chip (not shown) of the same type as the first and second semiconductor chips 120a and 120b is stacked on the second semiconductor chip 120b, the third semiconductor chip may be disposed to form an L-shaped step structure with the first and second semiconductor chips 120a and 120b. In this case, a third chip selection pad of the third semiconductor chip may be connected to the package substrate 110 through a wire passing through the second chip dummy pad DPb. A third chip dummy pad of the third semiconductor chip may not be connected to any wire and thus may be electrically isolated. This will be described in detail with reference to FIG. 6 later.

The second chip wire W2, which connects the first chip activation pad APa disposed along the first side S1 of the first semiconductor chip 120a to the second chip activation pad APb disposed along the first side T1 of the second semiconductor chip 120b, may subtend a predetermined angle with the first direction (Y direction), as viewed in plan.

Referring to FIG. 3, the second auxiliary wire aW2, which connects the first chip dummy pad DPa disposed adjacent to the first side S1 of the first semiconductor chip 120a to the second chip selection pads CE/CSb disposed adjacent to the first side T1 of the second semiconductor chip 120b, may subtend a smaller angle with the first direction (Y direction) than the second chip wire W2.

Specifically, when viewed from above the semiconductor package 100, the angle θ2 between a direction normal to the first side T1 and a direction in which the second chip wire W2 extends (i.e., its longitudinal direction) may be greater than the angle θ1 between the direction normal to the first side T1 and a direction in which the second auxiliary wire aW2 extends. Also, the angle θ1 may be 0 degrees, but is not limited thereto.

The first chip selection pad CE/CSa and the first chip dummy pad DPa are successively arranged along the first side S1 extending in the second direction (X direction). That is, no other pads are interposed between the first chip selection pad CE/CSa and the first dummy pad DPa. The first chip dummy pad DPa is disposed behind the first chip selection pad CE/CSa relative to the vertex at which the first and second sides S1 and S2 meet. The first chip dummy pad DPa may be so positioned for preventing the second selection wire SW2 from intersecting or crossing (over or under) the second chip wire W2.

Figure 6:
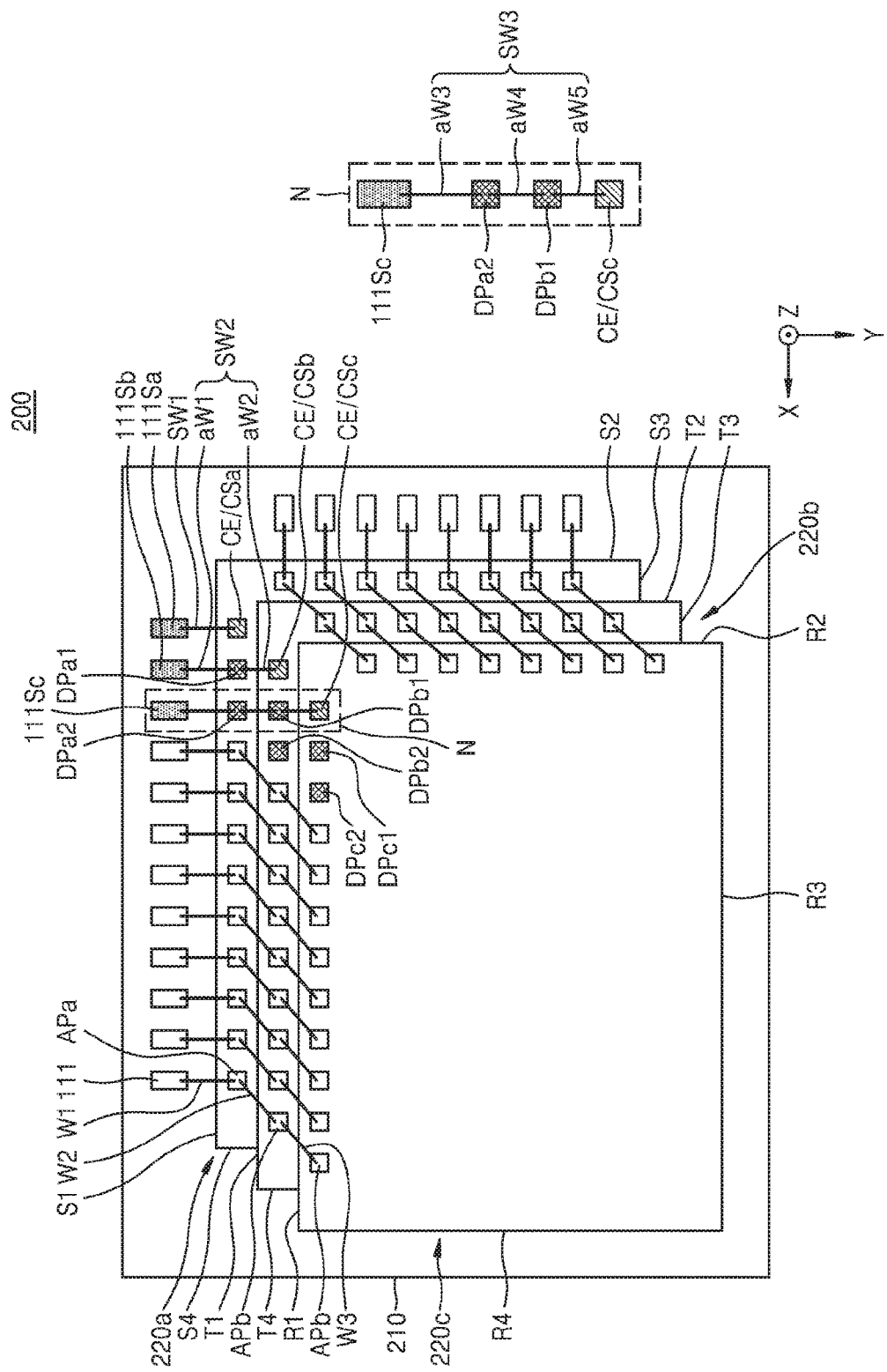
FIG. 6 is a plan view of a semiconductor package according to the inventive concept.

Furthermore, a number of first chip dummy pads DPa equal to the number of semiconductor chips arranged on the first semiconductor chip 120a may be disposed next to the first chip selection pad CE/CSa. In the example of FIGS. 1 to 4D, because only one second semiconductor chip 120b is disposed on the first semiconductor chip 120a, only one first dummy pad DPa may be disposed next to the first chip selection pad CE/CSa. In other examples, several first chip dummy pads DPa may be successively arranged next to the first chip selection pad CE/CSa along the first side S1. For example, as shown in FIG. 6 (described in more detail later on), two semiconductor chips, i.e., second semiconductor chip 220b and third semiconductor chip 220c, are disposed on the first semiconductor chip 220a and thus, a first-first chip dummy pad DPa1 and a first-second chip dummy pad DPa2 may be successively arranged next to the first chip selection pad CE/CSa, and a second-first chip dummy pad DPb1 and a second-second chip dummy pad DPb2 may be successively arranged next to the second chip selection pad CE/CSb.

As described above, because the first and second semiconductor chips 120a and 120b are of the same type, the positional relationships between the first chip selection pad CE/CSa and the first chip dummy pad DPa may be similarly applied to the second chip selection pad CE/CSb and the second chip dummy pad DPb of the second semiconductor chip 120b.

Figure 5:
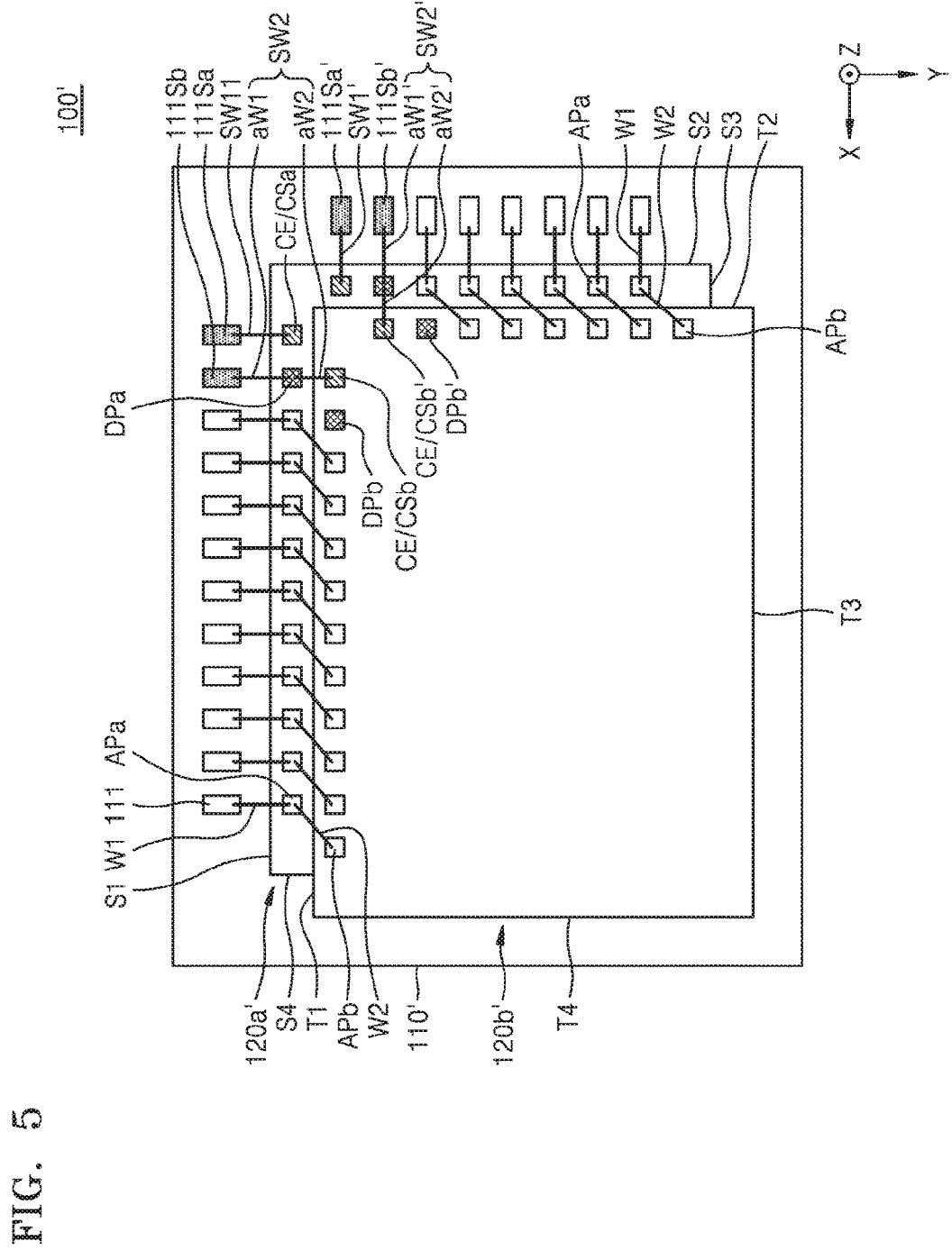
FIG. 5 is a plan view of a semiconductor package according to the inventive concept.

FIG. 5 is a plan view of another example of a semiconductor package 100' according to the inventive concept. The semiconductor package 100' is similar to the semiconductor package 100 described with reference to FIGS. 1 to 4D except that each semiconductor chip of the semiconductor package 100' includes two chip selection pads and two chip dummy pads.

Referring to FIG. 5, the semiconductor package 100' may include a first semiconductor chip 120a' and a second semiconductor chip 120b', sequentially stacked on a package substrate 110'. The first and second semiconductor chips 120a' and 120b' may be the same types of semiconductor chips.

The package substrate 110' may include first chip selection substrate pads 111Sa and 111Sa' for transmitting a chip enable signal/chip select signal for activating/selecting the first semiconductor chip 120a', second chip selection substrate pads 111Sb and 111Sb' for transmitting a chip enable signal/chip select signal for activating/selecting the second semiconductor chip 120a', and an active substrate pad 111 for transmitting various electrical signals for driving the first and second semiconductor chips 120a' and 120b'. The substrate pads 111, 111Sa, 111Sa', 111Sb, and 111Sb' may have an L-shaped pad arrangement corresponding to the pad arrangements of the first and second semiconductor chips 120a' and 120b'.

The first semiconductor chip 120a' may include first chip selection pads CE/CSa and CE/CSa' for transmitting a chip enable signal/chip selection signal, first chip dummy pads DPa and DPa' electrically isolated from an internal circuit of the first semiconductor chip 120a', and a first chip activation pad APa for transmitting various electrical signals for driving the first semiconductor chip 120a'. One or more of the first chip selection pad CE/CSa, the first chip dummy pad DPa, and the first chip activation pad APa may be arranged along a first side S1 of the first semiconductor chip 120a'. In addition, one or more of the first chip selection pad CE/CSa', the first chip dummy pad DPa', and the first chip activation pad APa' may be arranged along a second side S2 of the first semiconductor chip 120a'.

The first chip selection pad CE/CSa' may be connected to the first chip selection substrate pad 111Sa' through a first chip selection wire SW1'. The first chip dummy pad DPa' disposed directly adjacent to the first chip selection pad CE/CSa' may be connected to the second chip selection substrate pad 111Sb' through a first auxiliary wire aW1

A second chip selection pad CE/CSb' may be connected to the first chip dummy pad DPa' through a second auxiliary wire aW2'. The first and second auxiliary wires aW1' and aW2' may constitute a second chip selection wire SW2'.

The first chip selection pad CE/CSa' and the first chip dummy pad DPa' are successively arranged along the second side S2 of the first semiconductor chip 120a'. The first chip dummy pad DPa' is located at a position farther than the first chip selection pad CE/CSa' relative to a vertex at which the first and second sides S1 and S2 meet. The pad arrangement of the second semiconductor chip 120b' is the same as that of the first semiconductor chip 120a'. The first and second chip dummy pads DPa' and DPb' may be so positioned relative to each other for preventing a second chip selection wire SW2' and a second chip wire W2 from having to cross.

In correspondence with the continuous arrangement of the first chip selection pad CE/CSa' and the first chip dummy pad DPa', the first and second chip selection substrate pads 111Sa' and 111Sb' may also be successively arranged.

Although FIG. 5 shows an example in which a pair of the first chip selection pad CE/CSa and the first chip dummy pad DPa and another pair of the first chip selection pad CE/CSa' and the first chip dummy pad DPa' are arranged along the first side S1 and the second side S2, respectively, the inventive concept is not limited thereto. For example, the pair of the first chip selection pad CE/CSa and the first chip dummy pad DPa and the pair of the first chip selection pad CE/CSa' and the first chip dummy pad DPa' may be arranged along any one of the first and second sides S1 and S2.

Although FIG. 5 shows an example in which the first semiconductor chip 120a' includes the first chip selection pads CE/CSa and CE/CSa' and the first chip dummy pads DPa and DPa', the inventive concept is not limited thereto. For example, the first semiconductor chip 120*a*' may include three or more first chip selection pads and three or more first chip dummy pads.

Although FIG. 5 shows an example in which a wire is used as a connecting member between the package substrate 110' and the first semiconductor chip 120*a*' and between the first semiconductor chip 120*a*' and the second semiconductor chip 120*b*', the inventive concept is not limited thereto. The connecting member may constitute a connection structure formed directly on a portion of the top surface of the package substrate 110' and on portions of the side surfaces and portions of the top surfaces of the first and second semiconductor chips 120*a*' and 120*b*', or may constitute a connection structure formed directly on an insulating layer with the insulating layer interposed therebetween.

FIG. 6 is a plan view of another example of a semiconductor package 200 according to the inventive concept. The semiconductor package 200 is similar to the semiconductor package 100 of FIGS. 1 to 4D, but has a structure in which three semiconductor chips are stacked and each of the three semiconductor chips includes two chip dummy pads.

Referring to FIG. 6, the semiconductor package 200 may include a first semiconductor chip 220*a*, a second semiconductor chip 220*b*, and a third semiconductor chip 220*c*, stacked in this order on a package substrate 210. The first to third semiconductor chips 220*a*, 220*b*, and 220*c* may be of the same type.

The package substrate 210 may include first to third chip selection substrate pads 111Sa, 111Sb, and 111Sb for transmitting chip enable signals/chip select signals of the first to third semiconductor chips 220*a*, 220*b*, and 220*c*, respectively, and an active substrate pad 111 for transmitting various electrical signals for driving the first to third semiconductor chips 220*a*, 220*b* and 220*c*. The substrate pads 111, 111Sa, 111Sb, and 111Sc may have an L-shaped pad arrangement corresponding to the pad arrangements of the first to third semiconductor chips 220*a*, 220*b*, and 220*c*.

The first to third semiconductor chips 220*a*, 220*b*, and 220*c* are arranged so that their corresponding portions are oriented as facing in the same direction. That is, the first to third semiconductor chips 220*a*, 220*b*, and 220*c* are arranged so that first sides S1, T1, and R1 are parallel to the second direction (X direction) and second sides S2, T2, and R2 are parallel to the first direction (Y direction).

In this case, the second semiconductor chip 220*b* may be disposed on the first semiconductor chip 220*a* so as not to overlap the L-shaped pad arrangement of the first semiconductor chip 220*a*. Likewise, the third semiconductor chip 220*c* may be disposed on the second semiconductor chip 220*b* so as not to overlap the L-shaped pad arrangement of the second semiconductor chip 220*b*. More specifically, the second semiconductor chip 220*b* is disposed so that the first and second sides T1 and T2 of the second semiconductor chip 220*b* are positioned on the first semiconductor chip 220*a*, and the third semiconductor chip 220*c* is disposed so that the first and second sides R1 and R2 of the third semiconductor chip 220*c* are positioned on the second semiconductor chip 220*b*. Accordingly, the first to third semiconductor chips 220*a*, 220*b*, and 220*c* may be stacked to form an L-shaped step structure.

The first semiconductor chip 220*a* may include first chip pads CE/CSa, DPa1, DPa2, and APa arranged along the first and second sides S1 and S2. The first chip pads CE/CSa, DPa1, DPa2, and APa may include a first chip selection pad CE/CSa for transmitting a chip enable signal/chip select signal, first chip dummy pads DPa1 and DPa2 electrically isolated from an internal circuit of the first semiconductor chip 220*a*, and a first chip activation pad APa for transmitting various electrical signals. The first chip dummy pad DPa1 may be disposed adjacent to the first chip selection pad CE/CSa, and the first chip dummy pad DPa2 may be disposed adjacent to the first chip dummy pad DPa1.

The second semiconductor chip 220*b* may include second chip pads CE/CSb, DPb1, DPb2, and APb arranged along the first and second sides T1 and T2. The second chip pads CE/CSb, DPb1, DPb2, and APb may include a second chip selection pad CE/CSb for transmitting a chip enable signal/ chip selection signal, second chip dummy pads DPb1 and DPb2 electrically isolated from an internal circuit of the second semiconductor chip 220*b*, and a second chip activation pad APb for transmitting various electrical signals. The second chip dummy pad DPb1 may be disposed adjacent to the second chip selection pad CE/CSb, and the second chip dummy pad DPb2 may be disposed adjacent to the second chip dummy pad DPb1.

The third semiconductor chip 220*c* may include third chip pads CE/CSc, DPc1, DPc2, and APc arranged along the first and second sides R1 and R2. The third chip pads CE/CSc, DPc1, DPc2, and APc may include a third chip selection pad CE/CSc for transmitting a chip enable signal/chip selection signal, third chip dummy pads DPc1 and DPc2 electrically isolated from an internal circuit of the third semiconductor chip 220*c*, and a third chip activation pad APc for transmitting various electrical signals. The third chip dummy pad DPc1 may be disposed adjacent to the third chip selection pad CE/CSc, and the third chip dummy pad DPc2 may be disposed adjacent to the third chip dummy pad DPc1.

The first chip selection pad CE/CSa may be electrically connected to the first chip selection substrate pad 111Sa through a first chip selection wire SW1. The first chip selection pad CE/CSa may not be connected to the second and third chip selection pads CE/CSb and CE/CSc and all the other pads of the second and third chip semiconductor chips 220*b* and 220*c* through a wire.

The second chip selection pad CE/CSb may be electrically connected to the second chip selection substrate pad 111Sb through a second chip selection wire SW2. In this case, the first chip dummy pad DPa1 serves as a pass-through pad for the second select wire SW2 between the second chip selection substrate pad 111Sb and the second chip selection pad CE/CSb. Because the first chip dummy pad DPa1 is electrically isolated from the internal circuit of the first semiconductor chip 220*a*, the first chip dummy pad DPa1 may be used for signal transmission to (the internal circuit of) the second semiconductor chip 220*b* but not to (the internal circuit of) the first semiconductor chip 220*a*.

Specifically, the second chip selection wire SW2 may include a first auxiliary wire aW1 and a second auxiliary wire aW2. The first auxiliary wire aW1 may connect the first chip dummy pad DPa1 to the second chip selection substrate pad 111Sb. The second auxiliary wire aW2 may connect the first chip dummy pad DPa1 to the second chip selection pad CE/CSb. In this case, the second chip selection pad CE/CSb may not be directly connected to the second chip selection substrate pad 111Sb and all the other pads of the package substrate 210 through a wire. The second chip selection pad CE/CSb may not be connected to the first chip selection pad CE/CSa and the first chip activation pad APa through a wire. In addition, the second chip selection pad CE/CSb may not be connected to the third chip selection pad CE/CSc and all the pads of the third chip semiconductor chip 220*c* through a wire.

The third chip selection pad CE/CSc may be electrically connected to the third chip selection substrate pad 111Sc through the third chip selection wire SW3. That is, the third chip selection pad CE/CSc may receive an external signal for selecting the third semiconductor chip 220c through the third chip selection wire SW3 and transmit the received signal to the internal circuit of the third semiconductor chip 220c. In this case, the first chip dummy pad DPa2 and the second chip dummy pad DPb1 may serve as pass-through pads for the third selection wire SW3 between the third chip selection pad CE/CSc and the third chip selection substrate pad 111Sc. The first chip dummy pad DPa2 is electrically isolated from the internal circuit of the first semiconductor chip 220a, and the second chip dummy pad DPb1 is electrically isolated from the internal circuit of the second semiconductor chip 220b. Accordingly, the first chip dummy pad DPa2 and the second chip dummy pad DPb1 may be used for signal transmission to the third semiconductor chip 220c but not to the first and second semiconductor chips 220a and 220b.

Specifically, the third chip selection wire SW3 may include a first auxiliary wire aW3, a second auxiliary wire aW4, and a third auxiliary wire aW5. The first auxiliary wire aW3 may connect the first chip dummy pad DPa2 to the third chip selection substrate pad 111Sc. The second auxiliary wire aW4 may connect the second chip dummy pad DPb1 to the first chip dummy pad DPa2. The third auxiliary wire aW5 may connect the second chip dummy pad DPb1 to the third chip selection pad CE/CSc. In this case, the third chip selection pad CE/CSc may not be directly connected to the third chip selection substrate pad 111Sc and all the other pads of the package substrate 210 through a wire. The third chip selection pad CE/CSc may not be connected to the first chip selection pad CE/CSa, the first chip dummy pad DPa1, and the first chip activation pad APa through a wire. In addition, the third chip selection pad CE/CSc may not be connected to the second chip selection pad CE/CSb, the second chip dummy pad DPb2, and the second chip activation pad APb through a wire.

Because the second chip dummy pad DPb2 is electrically isolated from the internal circuit of the second semiconductor chip 220b, the second chip dummy pad DPb2 is not used to transmit an electrical signal from an external device to the second semiconductor chip 220b. Therefore, the second chip dummy pad DPb may not be connected to any wire, and may be electrically isolated. Likewise, since the third chip dummy pad DPc1 and the third chip dummy pad DPc2 are electrically isolated from the internal circuit of the third semiconductor chip 220c, the third chip dummy pad DPc1 and the third chip dummy pad DPc2 are not used to transmit an electrical signal from the external device to the third semiconductor chip 220c. Therefore, the third chip dummy pads DPc1 and DPc2 may not be connected to any wire, and may be electrically isolated.

The first chip selection pad CE/CSa and the first chip dummy pads DPa1 and DPa2, formed along a second side S2 of the first semiconductor chip 220a, are successively arranged. That is, no other pads are interposed between the first chip selection pad CE/CSa and the first chip dummy pad DPa1 and between the first chip dummy pad DPa1 and the first chip dummy pad DPa2. The first chip dummy pads DPa1 and DPa2 are disposed behind the first chip selection pad CE/CSa relative to a vertex at which the first and second sides S1 and S2 meet. The disposition of the first chip dummy pads DPa1 and DPa2 may be for preventing the second and third selection wires SW2 and SW3 from having to cross and the second and third chip wires W2 and W3 from having to cross.

As described above, because the first and second semiconductor chips 220a and 220b are the same types of semiconductor chips, the positional relationships between the second chip dummy pads DPb1 and DPb2 of the second semiconductor chip 220b and the third chip dummy pads DPc1 and DPc2 of the third semiconductor chip 220c may be similarly applied to the first chip dummy pads DPa1 and DPa2.

Although FIG. 6 shows an example in which a wire is used as a connecting member between the package substrate 210 and the first semiconductor chip 220a, between the first semiconductor chip 220a and the second semiconductor chip 220b, and between the second semiconductor chip 220b and the third semiconductor chip 220c, the inventive concept is not limited thereto. The connecting member may constitute a connection structure formed directly on a portion of the top surface of the package substrate 210 and on portions of the side surfaces and portions of the top surfaces of the first to third semiconductor chips 220a, 220b, and 220c, or may constitute a connection structure formed directly on an insulating layer with the insulating layer interposed therebetween.

Figure 7:
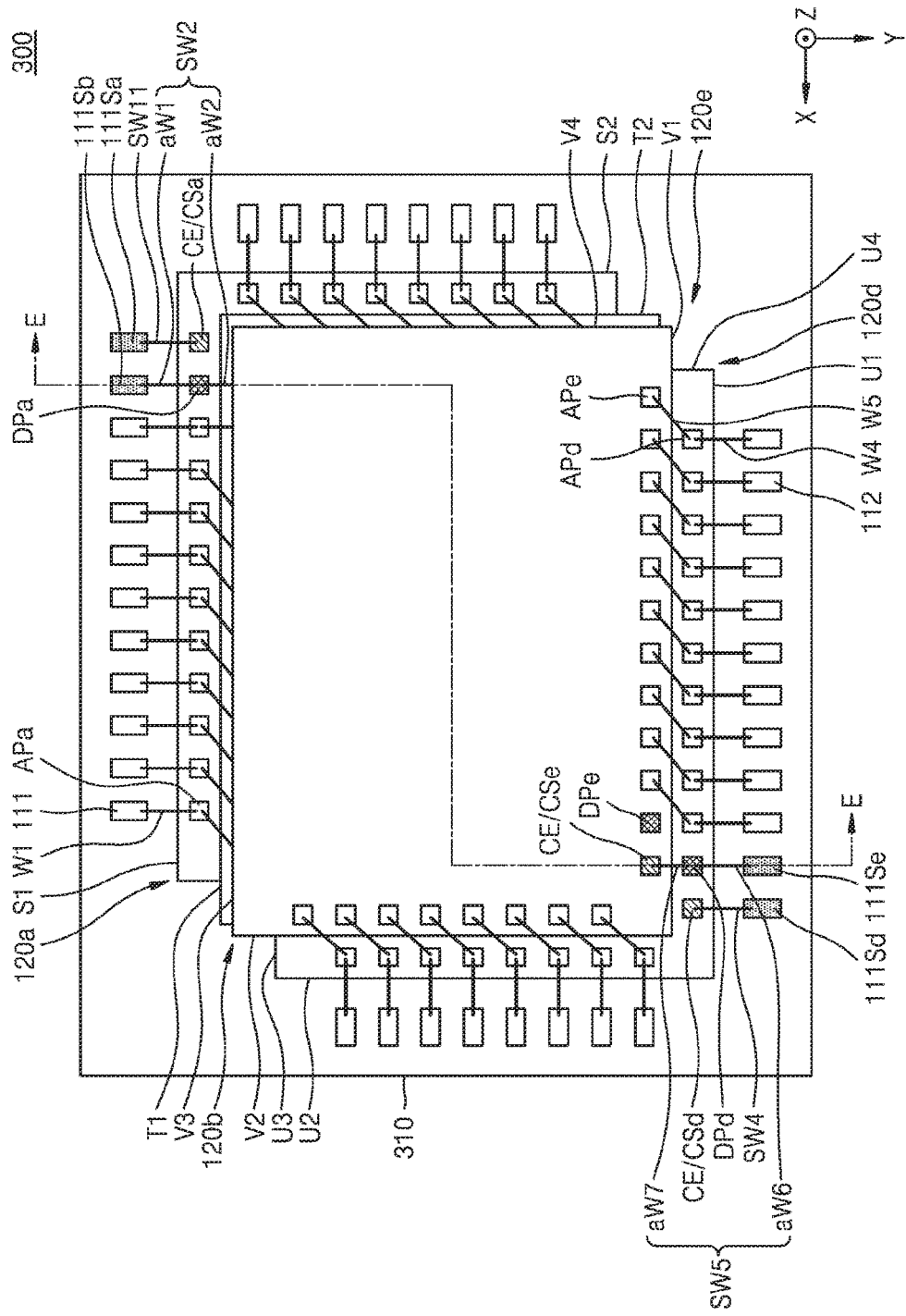
FIGS. 7 and 8 are respectively a plan view and a cross-sectional view of a semiconductor package according to the inventive concept.
Figure 8:
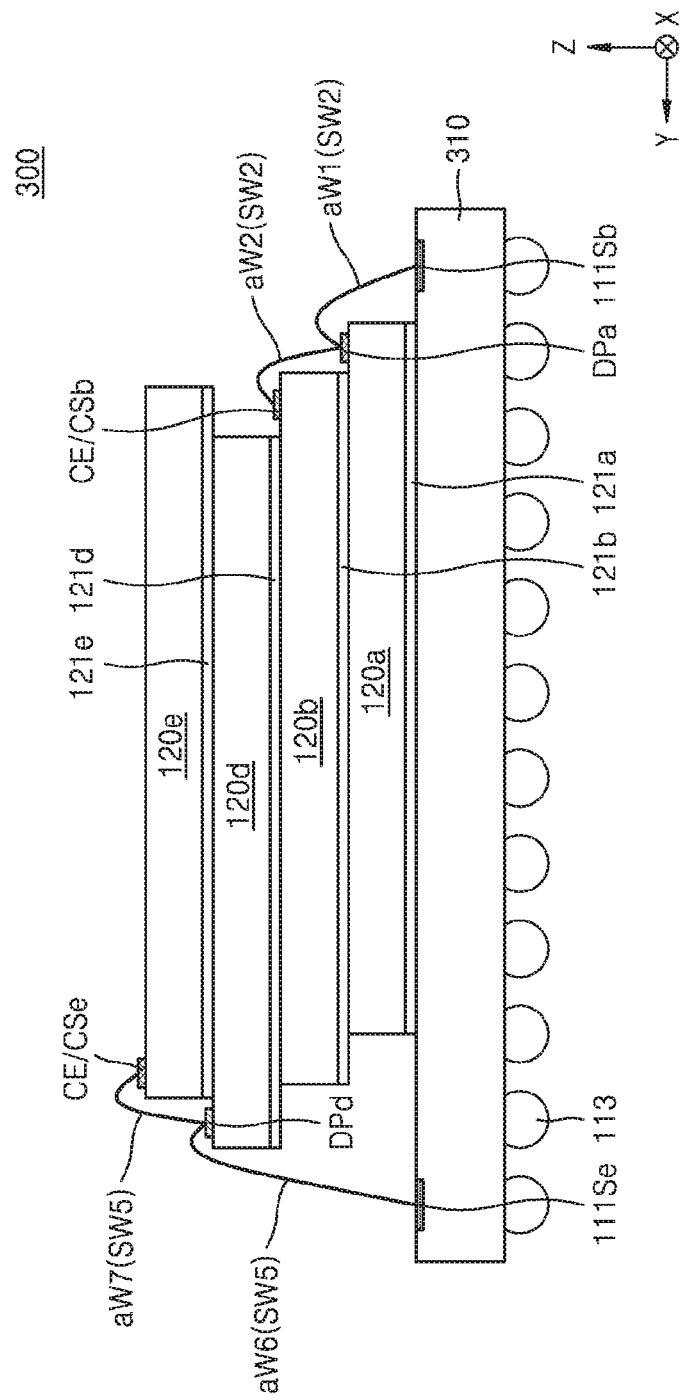

FIGS. 7 and 8 are respectively a plan view and a cross-sectional view of another example of a semiconductor package 300 according to the inventive concept. The semiconductor package 300 is similar to the semiconductor package 100 of FIGS. 1 to 4D except that a pair of third and fourth semiconductor chips 120d and 120e is stacked on a pair of first and second semiconductor chips 120a and 120b and the pair of third and fourth semiconductor chips 120d and 120e is electrically connected to substrate pads 112, 111Sd and 111Se that are different from those connected to the pair of the first and second semiconductor chips 120a and 120b.

Referring to FIGS. 7 and 8, the semiconductor package 300 may include the first semiconductor chip 120a, the second semiconductor chip 120b, the third semiconductor chip 120d, and the fourth semiconductor chip 120e which are sequentially stacked on a package substrate 310. The first to fourth semiconductor chips 120a, 120b, 120d, and 120e may be the same types of semiconductor chips. That is, as in the first and second semiconductor chips 120a and 120b, the third semiconductor chip 120d may include third chip pads CE/CSd, DPd, and APd arranged in an L-shape along first and second sides U1 and U2, and pads may not be provided in the peripheral regions including the third and fourth sides U3 and U4 facing the first and second sides U1 and U2, respectively. The fourth semiconductor chip 120e may also include fourth chip pads CE/CSe, DPe, and APe arranged in an L-shape along first and second sides V1 and V2, and pads may not be provided in peripheral regions including the third and fourth sides V3 and V4 facing the first and second sides V1 and V2, respectively.

The stack structure of the first and second semiconductor chips 120a and 120b is the same as that described with reference to FIGS. 1 to 4D. That is, the second semiconductor chip 120b may be disposed on the first semiconductor chip 120a so as not to overlap an L-shaped pad arrangement of the first semiconductor chip 120a. In this case, the second semiconductor chip 120b is disposed so that first and second sides T1 and T2 of the second semiconductor chip 120b are disposed on the first semiconductor chip 120a, the first side T1 is parallel to a second direction (X Direction), and the second side T2 is parallel to a first direction (Y direction).

The pair of the first and second semiconductor chips 120a and 120b may be electrically connected to first substrate pads 111, 111Sa, and 111Sb of the package substrate 310.

The third semiconductor chip 120d may be disposed on the stack structure of the first and second semiconductor chips 120a and 120b. The third semiconductor chip 120d may be disposed on the second semiconductor chip 120b so as not to overlap an L-shaped pad arrangement of the second semiconductor chip 120b. In this case, the third semiconductor chip 120d is disposed so that the third and fourth sides U3 and U4 are disposed on the second semiconductor chip 120b, the third side U3 is parallel to the second direction (X Direction), and the fourth side U4 is parallel to the first direction (Y direction). Accordingly, although the first to third semiconductor chips 120a, 120b and 120d are disposed to form an L-shaped step structure as in the semiconductor package 200 of FIG. 6, the third chip pads CE/CSd, DPd, and APd may be located opposite first chip pads CE/CSa, DPa, and APa and second chip pads CE/CSb, DPb, and APb. Therefore, the third semiconductor chip 120d may be electrically connected to substrate pads 112, 111Sd, and 111Se which are different from those connected to the first and second semiconductor chips 120a and 120b.

The fourth semiconductor chip 120e is disposed on the third semiconductor chip 120d. The stack structure of the third and fourth semiconductor chips 120d and 120e may be the same as the stack structure of the first and second semiconductor chips 120a and 120b. That is, the fourth semiconductor chip 120e may be disposed on the third semiconductor chip 120d so as not to overlap an L-shaped pad arrangement of the third semiconductor chip 120d. In this case, the fourth semiconductor chip 120e is disposed so that the first and second sides V1 and V2 are disposed on the third semiconductor chip 120d, the first side V1 is parallel to the second direction (X Direction), and the second side T2 is parallel to the first direction (Y direction). Accordingly, the fourth semiconductor chip 120e may overlap the L-shaped pad arrangement of the second semiconductor chip 120b in a third direction (Z direction). The pair of third and fourth semiconductor chips 120d and 120e may receive the same electrical signal through a second active substrate pad 112 of the package substrate 310.

Because the first to fourth semiconductor chips 120a, 120b, 120d and 120e are arranged so as not to align vertically with each other, the first to third adhesive members 121b, 121d, and 121e interposed between the first to fourth semiconductor chips 120a, 120b, 120d and 120e do not have to be relatively thick to accommodate electrically conductive connection structure. Accordingly, the semiconductor package 300 is relatively simple and inexpensive to manufacture cost.

In addition, as the pair of the first and second semiconductor chips 120a and 120b and the pair of the third and fourth semiconductor chips 120d and 120e share an electrical signal through the first and second active substrate pads 111 and 112, the problem of reliability degradation that occurs when a plurality of semiconductor chips share an electrical signal may be solved.

The package substrate 310 may include first L-shaped substrate pads 111, 111Sa, and 111Sb located in peripheral regions adjacent to the first sides S1 and T1 and the second sides S2 and T2 of the first and second semiconductor chips 120a and 120b to correspond to the L-shaped pad arrangements of the first and second semiconductor chips 120a and 120b. Also, the package substrate 310 may include second L-shaped substrate pads 112, 111Sd, and 111Se located in peripheral regions adjacent to the first sides U1 and V1 and the second sides U2 and V2 of the three and fourth semiconductor chips 120d and 120e to correspond to the L-shaped pad arrangements of the third and fourth semiconductor chips 120d and 120e. Accordingly, the first L-shaped substrate pads 111, 111Sa and 111Sb and the second L-shaped substrate pads 112, 111Sd and 111Se may collectively have a quadrilateral substrate pad arrangement that surrounds the four sides of the stack structure of the first to fourth semiconductor chips 120a, 120b, 120d and 120d.

The third chip pads CE/CSd, DPd and APd may include a third chip selection pad CE/CSd, a third chip dummy pad DPd and a third chip activation pad APd. The third chip selection pad CE/CSd may transmit a chip enable signal/chip selection signal for activating/selecting the third semiconductor chip 120d, and the third chip activation pad APd may transmit various electrical signals. The third chip dummy pad DPd is electrically isolated from an internal circuit of the third semiconductor chip 120d. The third chip dummy pad DPd may be disposed next to the third chip selection pad CE/CSd and be positioned behind the third chip selection pad CE/CSd relative to a vertex at which the first and second sides U1 and U2 meet.

Likewise, the fourth chip pads CE/CSe, DPe and APe may include a fourth chip selection pad CE/CSe, a fourth chip dummy pad DPe and a fourth chip activation pad APe. The fourth chip selection pad CE/CSe may transmit a chip enable signal/chip selection signal for activating/selecting the forth semiconductor chip 120e, and the fourth chip activation pad APe may transmit various electrical signals. The fourth chip dummy pad DPe is electrically isolated from an internal circuit of the fourth semiconductor chip 120e. The fourth chip dummy pad DPe may be disposed next to the fourth chip selection pad CE/CSe and be positioned behind the fourth chip selection pad CE/CSe relative to a vertex at which the first and second sides V1 and V2 meet.

Although FIGS. 7 and 8 show an example in which a wire is used as a connecting member between the package substrate 310 and the first semiconductor chip 120a, between the first semiconductor chip 120a and the second semiconductor chip 120b, between the package substrate 310 and the third semiconductor chip 120d, and between the third semiconductor chip 120d and the fourth semiconductor chip 120e. However, the inventive concept is not limited thereto. The connecting member may constitute a connection structure formed directly on a portion of the top surface of the package substrate 310 and on portions of the side surfaces and portions of the top surfaces of the first to fourth semiconductor chips 120a, 120b, 120d, and 120e, or may constitute a connection structure formed directly on an insulating layer with the insulating layer interposed therebetween.

Figure 9:
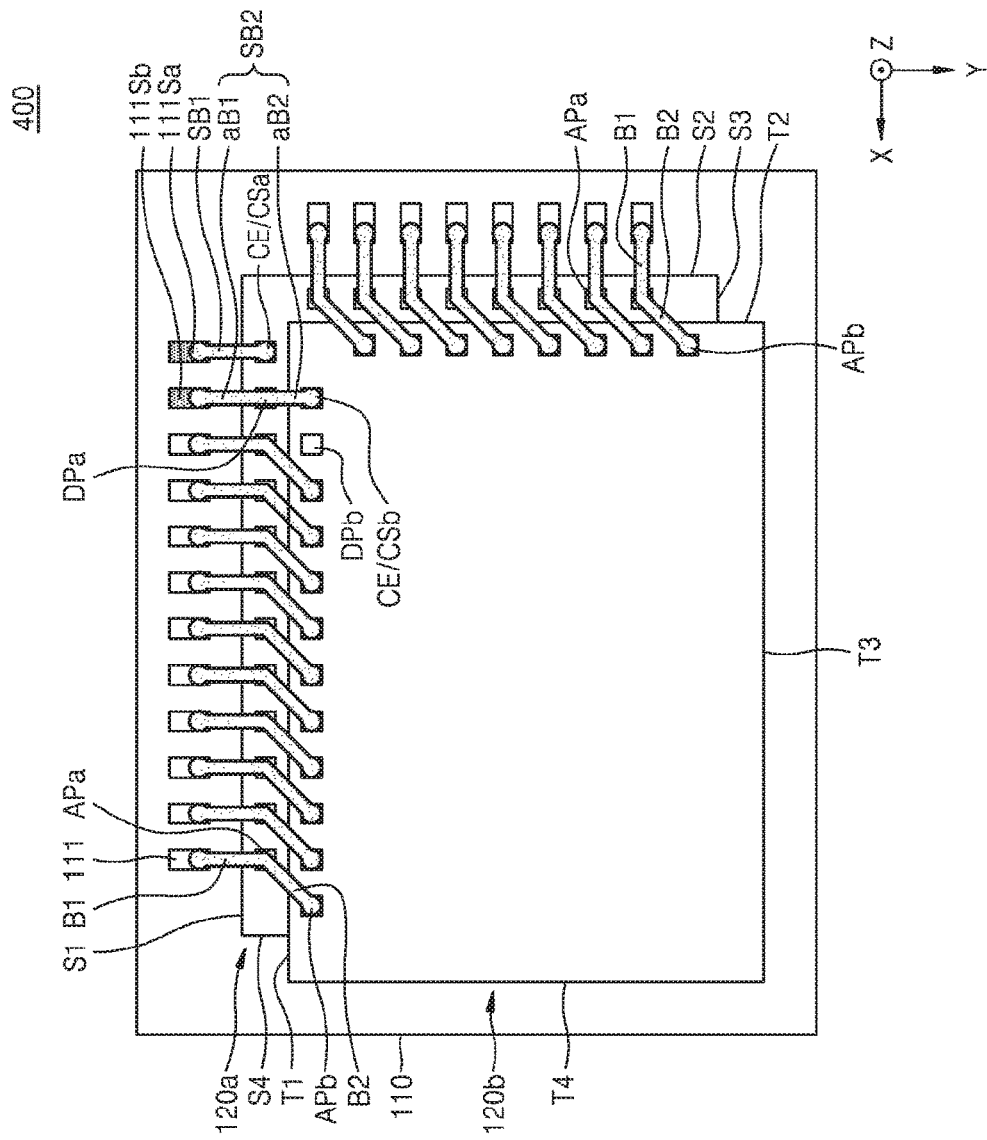
FIGS. 9 and 10 are respectively a plan view and a cross-sectional view of a semiconductor package according to the inventive concept.
Figure 10:
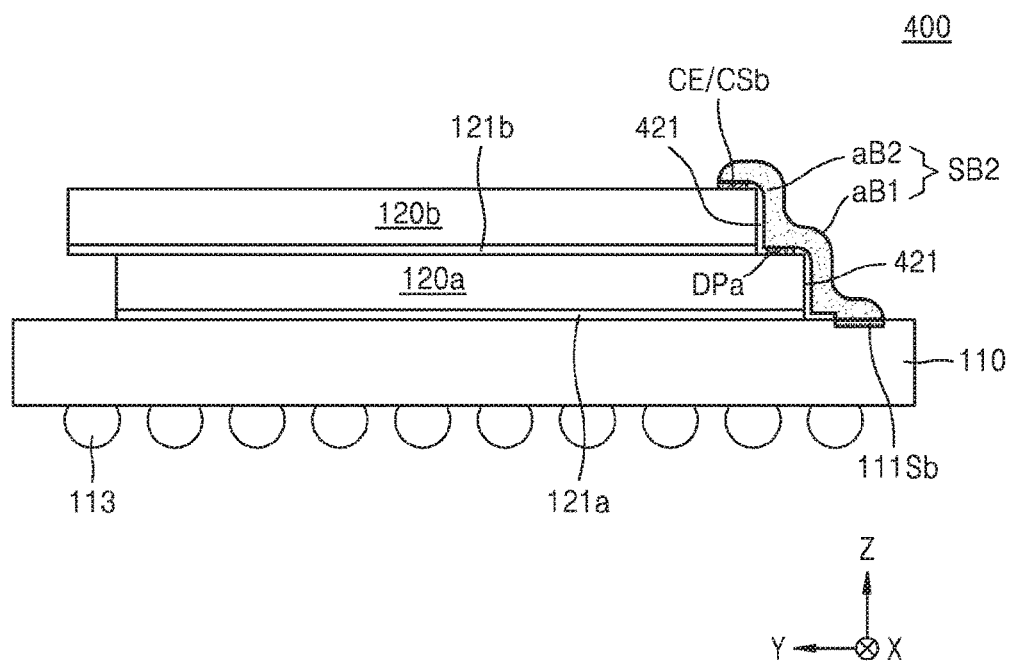

FIGS. 9 and 10 are respectively a plan view and a cross-sectional view of an example a semiconductor package 400 according to the inventive concept. The semiconductor package 400 is similar to the semiconductor package 100 of FIGS. 1 to 4D except that a connecting member between a package substrate 110 and a first semiconductor chip 120a and between the first semiconductor chip 120a and a second semiconductor chip 120b is not a wire.

Referring to FIGS. 9 and 10, the connecting member between the package substrate 110 and the first semiconductor chip 120a and between the first semiconductor chip 120a and the second semiconductor chip 120b may constitute a connection structure formed directly on portions of the side surfaces and portions of the top surfaces of the first and second semiconductor chips 120a and 120b, or may constitute a connection structure formed directly on an insulating layer 421 with the insulating layer 421 interposed between the side/top surfaces and the connection structure. That is, in a region other than substrate pads 111, 111Sa and 111Sb, first chip pads CE/CSa, DPa and APa, and second chip pads CE/CSb, DPb and APb, the connection structure may be electrically insulated from the package substrate 110 and the first and second semiconductor chips 120a and 120b.

Because the connection structure does not extend in its longitudinal direction upward from the second semiconductor chip 120b, the conductive path of an electrical signal provided by the connection structure is relatively short. The connection structure may include a conductive polymer or conductive ink, and may be formed by a dispensing method.

A first chip selection pad CE/CSa (i.e., the first chip pad CE/CSa) of the first semiconductor chip 120a and a first chip selection substrate pad 111Sa (i.e., the substrate pad 111Sa) of the package substrate 110 may be electrically connected to each other by a first chip selection member, e.g., a first chip selection structure SB1. The first chip selection structure SB1 may cover at least a portion of the top surface of the package substrate 110 and at least a portion of the side surface and at least a portion of the top surface of the first semiconductor chip 120a. In this case, an insulating layer 421 may be disposed on at least the portions of the top surface of the package substrate 110 and the portions of the side surface and top surface of the first semiconductor chip 120a between the pads 111Sa and CE/CSa and which would otherwise contact the first chip selection structure SB1. In FIG. 9, the insulating layer 421 is not shown for ease of illustration.

A chip selection pad of the second semiconductor chip 120b (i.e., the second chip pad CE/CSb) and a chip selection substrate pad of the package substrate 110 (i.e., the second substrate pad 111Sb) may be electrically connected to each other by a second chip selection member, e.g., a second chip selection structure SB2. The second chip selection structure SB2 may include a first auxiliary connector, e.g., a first auxiliary structure aB1, and a second auxiliary connector, e.g., a second auxiliary structure aB2. The first and second auxiliary structures aB1 and aB2 may be integral.

The first auxiliary structure aB1 may electrically connect the second chip selection substrate pad 111Sb of the package substrate 110 to a chip dummy pad DPa (i.e., the first chip pad DPa) of the first semiconductor chip 120a. The first auxiliary structure aB1 may cover a portion of the top surface of the package substrate 110 and portions of the side and top surfaces of the first semiconductor chip 120a. In this case, an insulating layer 421 may be disposed on at least the portions of the top surface of the package substrate 110 and the portions of the side surface and top surface of the first semiconductor chip 120a between the pads 11Sb and DpA and which would otherwise contact the first auxiliary structure aB1.

The second auxiliary structure aB2 may electrically connect the first chip dummy pad DPa of the first semiconductor chip 120a to the second chip selection pad CE/CSb of the second semiconductor chip 120b. The second auxiliary structure aB2 may cover a portion of the top surface of the first semiconductor chip 120a and portions of the side and top surfaces of the second semiconductor chip 120b. In this case, an insulating layer 421 may be disposed on at least the portion of the top surface of the first semiconductor chip 120a and the portions of the side and top surfaces of the second semiconductor chip 120b between the pads DPa and CE/CSb and which would otherwise contact the second auxiliary structure aB2.

An active substrate pad 111 of the package substrate 110 and a chip activation pad APa of the first semiconductor chip 120a (i.e., the first chip pad APa) may be connected to each other through a first chip connecting member, e.g., a first chip connection structure B1. The first chip activation pad APa of the first semiconductor chip 120a and a chip activation pad APb of the second semiconductor chip 120b (i.e., the second chip pad APb) may be connected to each other through a second chip connecting member, e.g., a second chip connection structure B2.

Although FIG. 10 shows an example in which the insulating layer 421 is formed on only portions of the outer surfaces of the first and second semiconductor chips 120a and 120b, the inventive concept is not limited thereto. The insulating layer 421 may be formed to cover the remaining outer surfaces of the first and second semiconductor chips 120a and 120b.

FIGS. 11A to 11D are cross-sectional views illustrating a method of manufacturing a semiconductor package, according to the inventive concept. First, as described above with reference to FIG. 2, first and second semiconductor chips 120a and 120b of the same type may be provided. Here, as in above, the term "same type" refers to chips that have the same physical characteristics (dimensions, number and arrangement of pads, etc.) and function (memory, for example). The chips 120a and 120b may be identical.

Figure 11A:
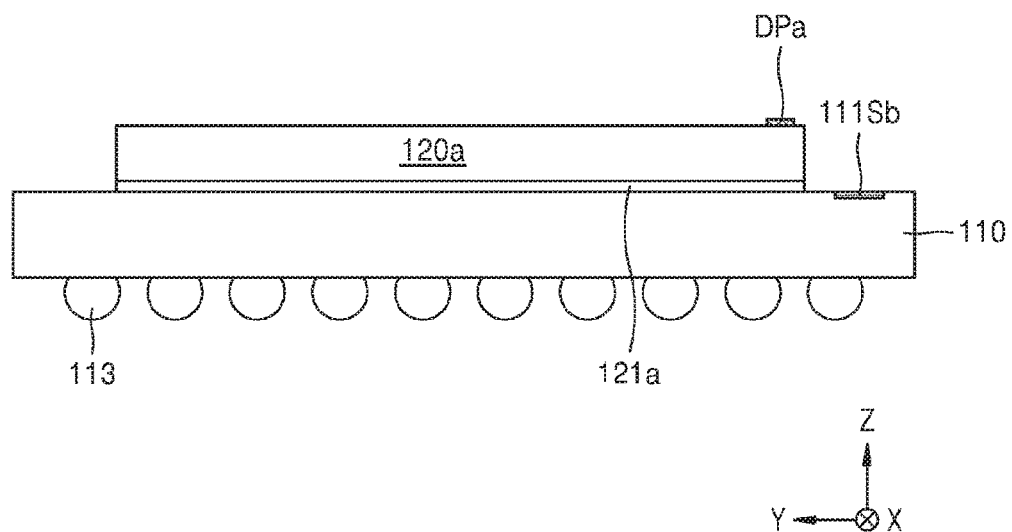
FIGS. 11A, 11B, 11C and 11D are cross-sectional views illustrating a method of manufacturing a semiconductor package, according to the inventive concept.

Referring to FIGS. 2 and 11A, a first adhesive member 121a may be formed on the bottom surface of the first semiconductor chip 120a, and the first semiconductor chip 120a may be mounted on a package substrate 110. However, the first adhesive member 121a may be previously attached, at a wafer level, to the bottom surface of the first semiconductor chip 120a by an individualization process of semiconductor chips.

Figure 11B:
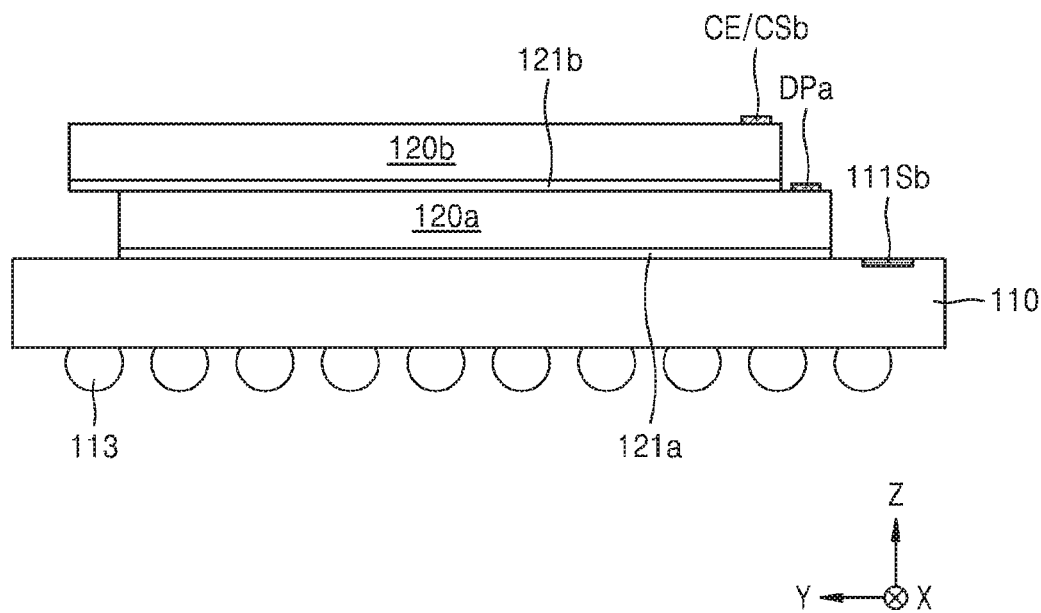

Referring to FIGS. 2 and 11B, a second adhesive member 121b may be formed on the bottom surface of the second semiconductor chip 120a, and the second semiconductor chip 120a may be disposed on the first semiconductor chip 120 as offset therefrom in the X and Y directions so as not to overlap an L-shaped pad arrangement of the first semiconductor chip 120. That is, first and second sides T1 and T2 of the second semiconductor chip 120b may be each partially disposed on the first semiconductor chip 120a, and may be disposed parallel to first and second sides S1 and S2 of the first semiconductor chip 120a, respectively. Accordingly, the second adhesive member 121b may be thin because it does not have to accommodate for a vertical dimension of a wire connected to a pad of the first semiconductor chip 120a.

Figure 11C:
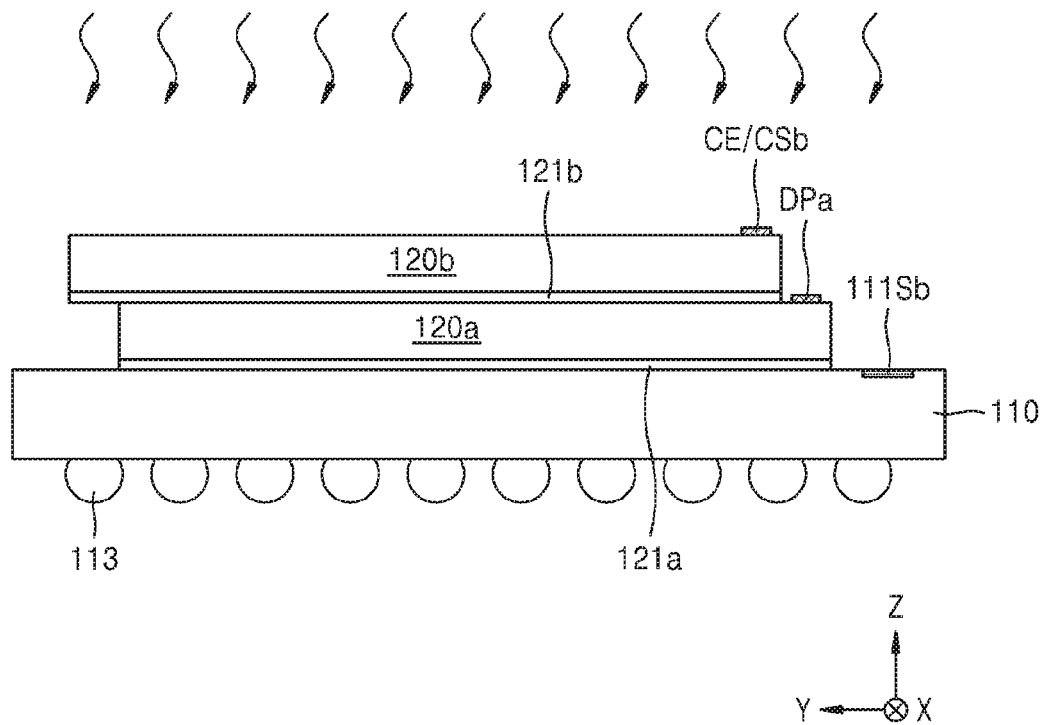

Referring to FIGS. 2 and 11C, the first and second adhesive members 121a and 121b may be cured through a curing process.

Conventional wisdom is that in methods of manufacturing these types of semiconductor packages having a stack of semiconductor chips, a wire bonding process for the lower semiconductor chip must be performed before the upper semiconductor chip is mounted on the lower chip. Accordingly, the curing process needs to be performed a plurality of times, thereby rendering the process of manufacturing the semiconductor package complex. However, according to the inventive concept, the semiconductor package may be manufactured by sequentially mounting the first and second semiconductor chips 120a and 120b on the package substrate 110 by using the first and second adhesive members 121a and 121b, curing the first and second adhesive members 121a and 121b through a single curing process, and then performing wire bonding. Accordingly, the manufacturing of the semiconductor package is relatively simple and hence, the method is efficient and semiconductor packages can be produced using the method with a high degree of productivity and at a low cost.

Figure 11D:
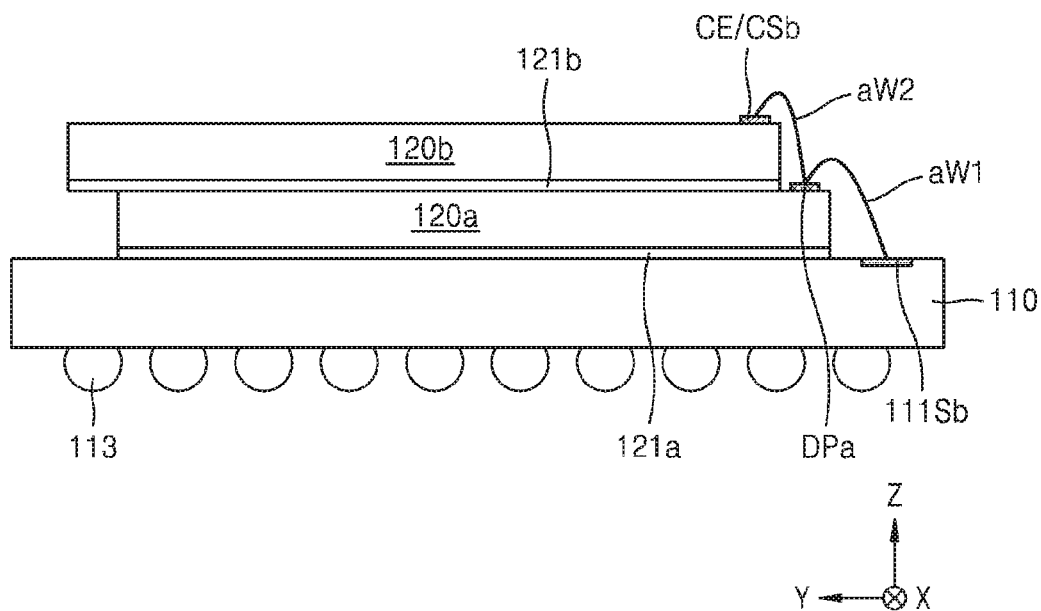

Referring to FIGS. 2 and 11D, a first chip selection wire SW1, a first auxiliary wire aW1, and a first wire W1 may be formed to connect the package substrate 110 to the first semiconductor chip 120*a*. For example, by using a wire bonding method, one end of the first auxiliary wire aW1 may be connected to a second chip selection substrate pad 111Sb and the other end may be connected to a first chip dummy pad DPa.

A second auxiliary wire aW2 and a second wire W2 may be formed to connect the first semiconductor chip 120*a* to the second semiconductor chip 120*b*. For example, by using a wire bonding method, one end of the second auxiliary wire aW2 may be connected to a first chip dummy pad DPa and the other end may be connected to a second chip selection pad CE/CSb.

In this case, a wire between the package substrate 110 and the first semiconductor chip 120*a* and a wire between the first semiconductor chip 120*a* and the second semiconductor chip 120*b* may be formed at the same time, or may be formed in any order.

Next, although not shown, a molding member may be formed to cover the first and second semiconductor chips 120*a* and 120*b* and the wires SW1, aW1, aW2, W1 and W2. The molding member may include an epoxy molding compound (EMC) or an insulating resin.

FIGS. 11A to 11D illustrate a method of manufacturing the semiconductor package 100 of FIGS. 1 to 4D. However, it is clear that a manufacturing method similar to that of FIGS. 11A to 11D may be carried out according to the inventive concept to manufacture any of the semiconductor packages 100', 200, 300, and 400.

The semiconductor package 100' of FIG. 5 may be manufactured by the manufacturing method of FIGS. 11A to 11D after providing the first and second semiconductor chips 120*a*' and 120*b*' each including two selection pads and two dummy pads.

The semiconductor package 200 of FIG. 6 may be manufactured by mounting the third semiconductor chip 220*c* via an adhesive member attached to the bottom surface thereof on the second semiconductor chip 220*b* after mounting the second semiconductor chip 220*b* on the first semiconductor chip 220*a*, and then performing the curing process of FIG. 11C and the wire formation process of FIG. 11D.

The semiconductor package 300 of FIGS. 7 and 8 may be manufactured by mounting the third and fourth semiconductor chips 120*d* and 120*e* with an adhesive member attached to the bottom surfaces thereof on the second semiconductor chip 120*b* after mounting the second semiconductor chip 120*b* on the first semiconductor chip 120*a*, and then performing the curing process of FIG. 11C and the wire formation process of FIG. 11D.

In the manufacture of the semiconductor package 400 of FIGS. 9 and 10, after the first and second semiconductor chips 120*a* and 120*b* are mounted on the package substrate 110 according to the processes of FIGS. 11A to 11C, the insulating layer 421 may be formed on a resultant structure. The insulating layer 421 may be formed by a parylene coating process, but is not limited thereto. The insulating layer 421 may be formed to prevent current leakage from the package substrate 110 and the first and second semiconductor chips 120*a* and 120*b*.

Subsequently, a portion of the coating (e.g., the parylene coating) may be removed so that the remnant thereof is insulating layer 421 exposing top surfaces of the substrate pads 111, 111Sa, and 111Sb of the package substrate 110, the surfaces of the first chip pads CE/CSa, DPa, and APa of the first semiconductor chip 120*a*, and the top surfaces of the second chip pads CE/CSb, DPb, and APb of the second semiconductor chip 120*b*. In this case, a laser ablation method may be used to selectively remove portions of the coating, but the inventive concept is not limited thereto.

Next, referring to FIGS. 9 and 10, the first chip selection structure SB1, the second chip selection structure SB2 including the first and second auxiliary structures aB1 and aB2, and the first and second chip connection structures B1 and B2, which include a conductive material, may be formed by using a dispensing method or the like. In this case, the first and second chip connection structures B1 and B2 may include a conductive polymer or conductive ink, but are not limited thereto.

Figure 12:
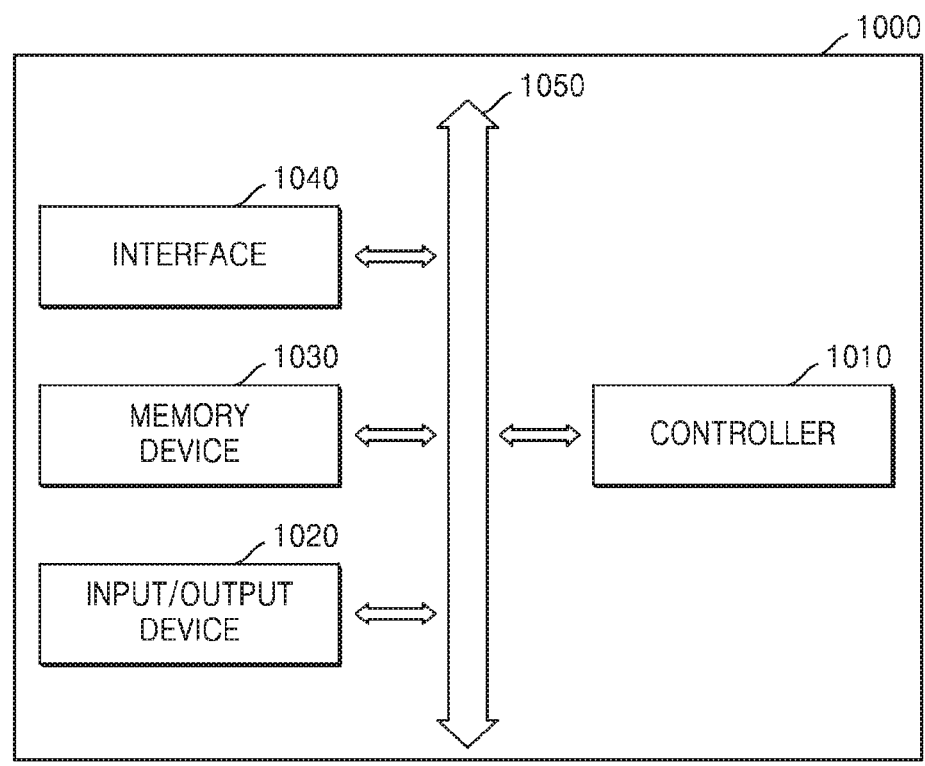
FIG. 12 is a block diagram of an example of a system including a semiconductor package according to the inventive concept.

FIG. 12 is a block diagram of a system 1000 including a semiconductor package according to any one of the examples described above.

Referring to FIG. 12, the system 1000 may include a controller 1010, an input/output device 1020, a memory device 1030, and an interface 1040. The system 1000 may be a mobile system or other system that transmits or receives information. Examples of the mobile system include a personal digital assistant (PDA), a portable computer, a web tablet, a wireless phone, a mobile phone, a digital music player, or a memory card. The controller 1010 is for controlling execution programs in the system 1000 and may be a microprocessor, a digital signal processor, a microcontroller, or the like. The input/output device 1020 may be used to input or output data of the system 1000. The system 1000 may be connected to an external device, e.g., a personal computer or network, by using the input/output device 1020, and may exchange data with the external device. The input/output device 1020 may be, for example, a keypad, a keyboard, or a display.

The memory device 1030 may store code and/or data for operation of the controller 1010, or may store data processed by the controller 1010. The memory device 1030 may include a semiconductor package according to any one of the examples described above. For example, the memory device 1030 may include at least one of the semiconductor packages 100, 100', 200, 300, and 400 illustrated in FIGS. 1 to 10.

The interface 1040 may provide a data transmission path between the system 1000 and another external device. The controller 1010, the input/output device 1020, the memory device 1030, and the interface 1040 may communicate with each other via a bus 1050. The system 1000 may be used in a mobile phone, an MP3 player, a navigation system, a portable multimedia player (PMP), a solid state disk (SSD), or a household appliance.

Although the inventive concept has been particularly shown and described with reference to examples thereof, it will be understood that various changes in form and details may be made thereto without departing from the spirit and scope of the inventive concept as defined by the following claims.

What is claimed is:

1. A semiconductor package comprising:
    a package substrate including electrically conductive terminals at an upper surface thereof;
    lower and upper semiconductor chips stacked on the upper surface of the package substrate with the upper semiconductor chip disposed on the lower semiconductor chip, each of the lower and upper semiconductor chips having an upper surface including a first side, the lower semiconductor chip comprising a chip selection pad dedicated to transmit a chip selection signal to an internal circuit of the lower semiconductor chip and a chip dummy pad electrically isolated from the internal circuit of the lower semiconductor chip successively disposed in a pad arrangement along the first side of the upper surface of the lower semiconductor chip, and a plurality of active pads disposed at the upper surface of the lower semiconductor chip and dedicated to transmit signals that drive the lower semiconductor chip, and the upper semiconductor chip comprising a chip selection pad dedicated to transmit a chip selection signal to an internal circuit of the upper semiconductor chip and a chip dummy pad electrically isolated from the internal circuit of the upper semiconductor chip successively disposed in a pad arrangement along the first side of the upper surface of the upper semiconductor chip, and a plurality of active pads disposed at the upper surface of the upper semiconductor chip and dedicated to transmit signals that drive the upper semiconductor chip;

a lower chip selection member electrically connecting the package substrate to the chip selection pad of the lower semiconductor chip;

an upper chip selection member comprising a first auxiliary connector electrically connecting the package substrate to the chip dummy pad of the lower semiconductor chip and a second auxiliary connector electrically connecting the chip dummy pad of the lower semiconductor chip to the chip selection pad of the upper semiconductor chip;

a respective first chip connecting member electrically each of the active pads of the lower semiconductor chip to the package substrate; and a respective second chip connecting member electrically connecting each of the plurality of active pads of the upper semiconductor chip to a respective one of the active pads of the lower semiconductor chip, wherein when the semiconductor package is viewed from above, an angle between a direction normal to the first side of the upper surface of the upper semiconductor chip and a direction in which the second chip connecting member extends lengthwise is greater than an angle between the direction normal to the first side of the upper surface of the upper semiconductor chip and a direction in which the second auxiliary connector extends lengthwise.

2. The semiconductor package of claim 1, wherein the upper surface of each of the lower and upper semiconductor chips has a second side that meets the first side thereof, all conductive pads at the upper surfaces of the lower and upper semiconductor chips, including the chip selection and dummy pads, are disposed along only the first and second sides of the lower and upper semiconductor chips, respectively, such that the pad arrangement of the lower and upper semiconductor chips are disposed is L-shaped.

3. The semiconductor package of claim 2, wherein the first and second sides of the upper semiconductor chip extend over the lower semiconductor chip so that the upper semiconductor chip does not overlap the L-shaped pad arrangement of the lower semiconductor chip, and the first and second sides of the upper semiconductor chip are respectively spaced apart from the first and second sides of the lower semiconductor chip.

4. The semiconductor package of claim 1, wherein the first auxiliary connector is a wire and the second auxiliary connector is a wire.

5. The semiconductor package of claim 1, wherein the first auxiliary connector covers portions of side and upper surfaces of the first semiconductor chip, the second auxiliary connector covers portions of side and upper surfaces of the second semiconductor chip, and the first and second auxiliary connectors are integral.

6. The semiconductor package of claim 5, wherein an insulating layer is interposed between the first auxiliary connector and a side surface of the lower semiconductor chip and between the second auxiliary connector and a side surface of the upper semiconductor chip.

7. The semiconductor package of claim 1, further comprising adhesive interposed between the upper semiconductor chip and the lower semiconductor chip, wherein a thickness of the adhesive is less than a height from the upper surface of the lower semiconductor chip to a highest point of the lower chip selection member.

8. The semiconductor package of claim 1, wherein the upper surface of each of the lower and upper semiconductor chips has a second side that meets the first side thereof at a vertex, and the chip dummy pad of each respective one of the lower and upper semiconductor chips is located behind the chip selection pad thereof with respect to the vertex.

9. The semiconductor package of claim 1, wherein the chip dummy pad of the upper semiconductor chip is electrically isolated from the exterior of the semiconductor package.

10. The semiconductor package of claim 1, wherein the number of electrically conductive connecting members directly electrically connecting the pads at the upper surface of the lower semiconductor chip, respectively, to the package substrate is greater than the number of electrically conductive connecting members directly connected to the pads at the upper surface of the upper semiconductor chip.

11. A The semiconductor package comprising:

a package substrate including electrically conductive terminals at an upper surface thereof;

lower and upper semiconductor chips stacked on the upper surface of the package substrate with the upper semiconductor chip disposed on the lower semiconductor chip, wherein each of the lower and upper semiconductor chips has an upper surface including a first side, the lower semiconductor chip comprises a chip selection pad dedicated to transmit a chip selection signal to an internal circuit of the lower semiconductor chip and a chip dummy pad electrically isolated from the internal circuit of the lower semiconductor chip successively disposed in a pad arrangement along the first side of the upper surface of the lower semiconductor chip, and the upper semiconductor chip comprises a chip selection pad dedicated to transmit a chip selection signal to an internal circuit of the upper semiconductor chip and a chip dummy pad electrically isolated from the internal circuit of the upper semiconductor chip successively disposed in a pad arrangement along the first side of the upper surface of the upper semiconductor chip;

a lower chip selection member electrically connecting the package substrate to the chip selection pad of the lower semiconductor chip; and an upper chip selection member comprising a first auxiliary connector electrically connecting the package substrate to the chip dummy pad of the lower semiconductor chip and a second auxiliary connector electrically connecting the chip dummy pad of the lower semiconductor chip to the chip selection pad of the upper semiconductor chip, wherein the number of chip dummy pads of the lower semiconductor chip at the upper surface thereof is equal to or greater than the number of semiconductor chips stacked on the lower semiconductor chip in the semiconductor package.

12. A semiconductor package comprising:

a package substrate;

first, second and third semiconductor chips stacked on the package substrate, wherein the first, second and third semiconductor chips are of same type and each of the first, second and third semiconductor chips has an arrangement of conductive pads including a chip selection pad dedicated to transmit a chip selection signal to an internal circuit of the semiconductor chip and first and second chip dummy pads electrically isolated from the internal circuit of the semiconductor chip, the chip selection pad and the chip dummy pads being disposed in succession in said arrangement adjacent a first side of the semiconductor chip;

a first chip selection member that connects the chip selection pad of the first semiconductor chip to the package substrate;

a second chip selection member comprising a first auxiliary connector that connects the first chip dummy pad of the first semiconductor chip to the package substrate and a second auxiliary connector that connects the chip selection pad of the second semiconductor chip to the first chip dummy pad of the first semiconductor chip; and a third chip selection member comprising a third auxiliary connector that connects the second chip dummy pad of the first semiconductor chip to the package substrate, a fourth auxiliary connector that connects the first chip dummy pad of the second semiconductor chip to the second chip dummy pad of the first semiconductor chip, and a fifth auxiliary connector that connects the chip selection pad of the third semiconductor chip to the first chip dummy pad of the second semiconductor chip.

13. The semiconductor package of claim 12, wherein the second chip dummy pad of the second semiconductor chip and the first and second chip dummy pads of the third semiconductor chip are not connected to a conductive connecting member.

14. The semiconductor package of claim 12, wherein each of the first, second and third semiconductor chips has a second side that intersects the first side of the chip at a corner of the chip, the arrangement of the conductive pads of each of the first, second and third semiconductor chips is L-shaped, and the L-shaped arrangement of the conductive pads of each of the first, second and third semiconductor chips is disposed adjacent the first side and second sides of the chip.

15. The semiconductor package of claim 14, wherein for each of the first, second and third semiconductor chips, the first chip dummy pad is located behind the chip selection pad with respect to the corner of the chip, and the second chip dummy pad is located behind the first chip dummy pad with respect to the corner.

16. The semiconductor package of claim 14, wherein the first and second sides of the second semiconductor chip are on the first semiconductor chip so that the second semiconductor chip does not overlap the L-shaped arrangement of the conductive pads of the first semiconductor chip, wherein the first and second sides of the second semiconductor chip are respectively spaced apart from the first and second sides of the first semiconductor chip, and the first and second sides of the third semiconductor chip are on the second semiconductor chip so that the third semiconductor chip does not overlap the L-shaped arrangement of the conductive pads of the second semiconductor chip, wherein the first and second sides of the third semiconductor chip are respectively spaced apart from the first and second sides of the second semiconductor chip.

* * * * *